(12) United States Patent
Burns et al.

(10) Patent No.: US 6,751,272 B1
(45) Date of Patent: Jun. 15, 2004

(54) DYNAMIC ADJUSTMENT TO PRESERVE SIGNAL-TO-NOISE RATIO IN A QUADRATURE DETECTOR SYSTEM

(75) Inventors: Lawrence M. Burns, Mountain View, CA (US); Ravi Ramachandran, San Jose, CA (US); David Fisher, Menlo Park, CA (US); Chong Woo, Fremont, CA (US); Scott Mitchell, San Jose, CA (US)

(73) Assignee: 3Com Corporation, Santa Clara, CA (US)

(*) Notice: Subject to any disclaimer, the term of this patent is extended or adjusted under 35 U.S.C. 154(b) by 0 days.

(21) Appl. No.: 09/022,069

(22) Filed: Feb. 11, 1998

(51) Int. Cl.[7] ............................. H03D 1/00; H04L 27/06
(52) U.S. Cl. ...................................... 375/340; 375/259
(58) Field of Search ................................. 375/316, 319, 375/344, 325, 324, 340, 259, 260

(56) References Cited

U.S. PATENT DOCUMENTS

| | | | | |
|---|---|---|---|---|
| 3,971,996 A | * | 7/1976 | Motley et al. ............... | 327/233 |
| 4,127,825 A | | 11/1978 | Blomley ...................... | 329/103 |
| 4,375,618 A | | 3/1983 | Jett, Jr. ....................... | 329/103 |
| 4,608,538 A | | 8/1986 | Anderson .................... | 329/103 |
| 4,752,742 A | | 6/1988 | Akaiwa ....................... | 329/105 |
| 4,965,867 A | * | 10/1990 | Tsuchida et al. ............ | 341/118 |
| 4,999,581 A | * | 3/1991 | Satoh .......................... | 324/309 |
| 5,042,052 A | * | 8/1991 | Roberts et al. .............. | 375/344 |
| 5,134,404 A | * | 7/1992 | Peterson ...................... | 341/111 |
| 5,150,383 A | * | 9/1992 | Misaizu et al. .............. | 329/304 |
| 5,293,135 A | | 3/1994 | McGinn ...................... | 329/337 |
| 5,394,109 A | | 2/1995 | Simard ........................ | 329/300 |
| 5,414,385 A | | 5/1995 | Worsham, Jr. ............... | 329/337 |
| 5,500,878 A | | 3/1996 | Iwasaki ....................... | 375/344 |
| 5,561,665 A | * | 10/1996 | Matsuoka et al. ........... | 370/206 |
| 5,577,056 A | * | 11/1996 | Malik et al. ................. | 371/57.2 |
| 5,596,298 A | * | 1/1997 | Miller et al. ................. | 329/337 |
| 5,617,060 A | * | 4/1997 | Wilson et al. ............... | 330/129 |
| 5,638,140 A | * | 6/1997 | Krishnamrthy et al. ..... | 348/735 |
| 5,694,389 A | * | 12/1997 | Seki et al. ................... | 370/208 |
| 5,737,035 A | * | 4/1998 | Rotzoll ........................ | 348/725 |
| 5,838,735 A | * | 11/1998 | Khullar ....................... | 375/319 |
| 5,938,790 A | * | 8/1999 | Marrow ....................... | 714/795 |
| 6,005,506 A | * | 12/1999 | Bazarjani et al. ............ | 341/143 |
| 6,009,129 A | * | 12/1999 | Kenney et al. .............. | 375/346 |
| 6,043,767 A | * | 3/2000 | Wakamatsu .................. | 341/118 |
| 6,175,728 B1 | * | 1/2001 | Mitama ........................ | 455/323 |

* cited by examiner

Primary Examiner—Jean B. Corrielus
(74) Attorney, Agent, or Firm—McDonnell Boehnen Hulbert & Berghoff LLP

(57) ABSTRACT

In a system that demodulates a frequency modulated signal using a quadrature detector circuit, an apparatus that tunes the output signal to compensate for any offset in the signal includes an offset adjustment circuit and a control circuit. The offset adjustment circuit is operably coupled to the control circuit which may consist of a DAC and a digital logic such as a computer CPU. The control circuit determines a correction signal in response to a sequence of sampled of the system output, and supplies the correction signal to the offset adjustment circuit. The offset adjustment circuit provides an offset correction signal in response to the correction signal, and combines the offset correction signal with the output of the quadrature detector to provide an offset adjusted signal at an output node.

36 Claims, 15 Drawing Sheets

DYNAMIC ADJUSTMENT TO PRESERVE SIGNAL-TO-NOISE RATIO IN A QUADRATURE DETECTOR SYSTEM

1. BACKGROUND OF THE INVENTION a. Field of the Invention

The present invention relates to the field of demodulation of frequency modulated data streams. More particularly, this invention relates to the dynamic adjustment of the output of a quadrature detector to compensate for DC offset errors in a demodulated data stream.

b. Description of Related Art

Many wireless data systems use a form of frequency modulation to modulate a carrier, due to its inherent simplicity. When frequency modulation is used to send and receive data, it is often referred to as Frequency-Shift Keying (FSK). A common implementation of FSK that is often used is to use a different frequency for each bit of information that is sent. For example, as illustrated in FIG. 1, if the bit is a logic "1", one could transmit a frequency $f_1$ that is slightly higher than some chosen carrier frequency $f_c$. If a logic "0" is sent, one would send a frequency $f_0$ that is slightly lower than some chosen carrier frequency $f_c$. In this implementation of FSK, as long as one is sending non-return-to-zero data, the carrier frequency itself is never sent. In some such single-bit FSK systems however, an unmodulated carrier may be used to signal the start and stop of a data packet.

In another implementation of FSK, one might choose to send more than two frequencies (each of the two frequencies is sometimes referred to as a tone). A good example of this is where one uses different frequencies to represent more than one bit at a time. In other words, one could use a symbol, where the symbol is a particular frequency, to represent particular groups of bits. For instance, as illustrated in FIG. 2, one could transmit four different tones, each representing a group of two bits. Thus, for a given amount of data, one can cut down on the rate at which the output is modulated as compared to the single-bit FSK discussed above, simply by sending more than one bit with each symbol. This will result in less transmitted bandwidth. In general, the outer tones of a multiple-bit FSK system would be equal to the two tones of a single-bit FSK system operating at the same carrier frequency. In other words, the two outer tones $f_0$ and $f_3$ of FIG. 2, would be at the same frequencies as $f_0$ and $f_1$ of FIG. 1.

In general, most FSK systems directly modulate a voltage controlled oscillator (VCO) in order to provide the frequency modulated data signal to be sent. The system is designed such that at the operating voltages of the digital input, the output frequency of the VCO is proportional to the input voltage. For example, a higher input voltage corresponds to a higher output frequency, and vice-versa. This is illustrated in FIG. 3. Often, a lowpass filter is used to bandlimit the input modulation signal prior to feeding it to the VCO. This results in a much narrower transmitted output spectrum from the VCO.

To receive the modulated signal, the reverse needs to be done. In other words, one needs to convert the frequency signal from the VCO back to a voltage signal which contains the original information. There are a variety of circuits that are well known in the art that can be used to perform this frequency-to-voltage conversion. These circuits include quadrature detectors, delay-line discriminators, frequency discriminators, ratio detectors and phase-locked loops. One such circuit, the quadrature detector circuit, is illustrated in FIG. 4 in simplified block diagram form. The quadrature detector is typically a four quadrant multiplier 40 which receives a frequency modulated signal s(t) as one input and multiplies this signal by a 90-degree phase shifted version 42 of this signal. Typically, the 90 degree phase shifted version 42 of the input signal is created using a tuning circuit 44 including an RLC network having a resistor R1, a capacitor C1 and an inductor L1 connected in parallel. The output q(t) of the multiplier 40 is a voltage that is proportional to the frequency of the input signal s(t). The output q(t) may then be further processed through a low pass filter 46 to provide an output r(t).

In a typical quadrature detector the two signals are exactly 90-degrees apart only at the carrier center frequency. If the input signal is below the carrier center frequency, then the phase-shifted version of the signal is less than 90-degrees apart and a negative voltage output from the quadrature detector results. If the input signal is above the carrier center frequency, then the output of the quadrature detector is positive.

FIG. 5 illustrates a typical FSK system in simplified block diagram form consisting of a VCO followed by a quadrature detector. The waveforms existing at various portions of the system are also illustrated. FIG. 6 illustrates a simple radio utilizing an FSK modulation scheme, and a quadrature detector in the demodulation path. In general, most radio systems will be far more complicated than the simple system shown here. Most systems would have one or more up and down frequency conversions, and would contain additional gain stages and filtering.

As illustrated in FIG. 6, the radio system includes an antenna 602, a transmit/receive switch 604, a receiver 606, and a transmitter 614. When the antenna 602 receives a signal, the signal is input to the transmit/receive switch 604, and further to the receiver 606 including a downconverter 608 and a quadrature detector 610. The signal from the receiver 606 is then input to an amplifier 612 that outputs a demodulated output signal. When a digital input signal is input to the transmitter 614, the signal is first input to a VCO 618 and then to an upconverter 616 that outputs an FSK modulated signal that is input to the transmit/receive switch 604.

Quadrature detectors are commonly used to demodulate FSK signals because they are simple to use and have low power dissipation. However, in order for the quadrature detector to perform optimally, the circuit should be tuned to precisely the carrier center frequency. This ensures that any input signal at the carrier center frequency has an output voltage of zero. If the quadrature detector is not tuned correctly, then a DC offset will be induced on the output of the demodulated bit stream as shown in FIG. 7. This DC offset will result in a degraded signal-to-noise ratio (SNR) on the output signal, which, in turn, will result in more bit errors, especially in the presence of noise.

One method of tuning a quadrature detector is to manually tune it via a trimmer capacitor or variable inductor in the aforementioned RLC network, at the time of manufacture. However, manually tuned quadrature detectors are not accurate and robust over the long term as they can drift off the center frequency due to temperature changes and aging.

One possible solution to this problem that is known in the prior art is to have some sort of automatic tuning mechanism that relies on adjusting the reactive RLC circuit back to its correct frequency. This can be tough to do on an integrated circuit however, where inductors are sparingly used, of poor quality, and not adjustable. Further, although on-chip capacitors can be made voltage adjustable, they tend to exhibit nonlinear transfer voltage and susceptibility to process and temperature variations.

Another possible solution to the problem of a mistuned quadrature detector is to use a large number of frequency downconversions in the system. For, the output of the VC0 can be downconverted such that the $+/-\Delta f$ is a significant percentage of the downconverted $f_c$. If the percentage is large enough, then the significance—measured by the number of bit errors in the final system output stream—of any mistuning may be reduced substantially. This solution however, besides not addressing the problem of actually tuning the quadrature detector, requires additional power and amplification/mixer circuitry to implement several stages of downconversion. Further, each stage of downconversion adds a significant number of frequency harmonics to the overall system which must be filtered out lest they be amplified within the system and seen as actual signals.

Accordingly, there is the need for an apparatus which will reduce the effect of a mistuned quadrature detector on the overall operation of a frequency modulated information system. This apparatus must be capable of overcoming the temperature and age drift problems inherent in manual adjustment of an RLC tuning circuit. Further, it must overcome the process quality and temperature sensitivity problems encountered as a result of attempting to automatically adjust the reactance of the RLC circuit. Still further, the apparatus must be robust enough to be able to offset the effects of a mistuned quadrature detector without the aid of significant frequency downconversion and its inherent space constraints and harmonics filtering problems.

2. SUMMARY OF THE INVENTION

The present invention provides an apparatus that compensates for any offset present in the input signal of a system that demodulates a frequency modulated input signal using a quadrature detector. The apparatus includes an offset adjustment circuit and a control circuit. The offset adjustment circuit is operably coupled to the control circuit which may consist of a DAC and a digital logic. The control circuit determines a correction signal and supplies the correction signal to the offset adjustment circuit. The offset adjustment circuit provides an offset correction signal in response to the correction signal, and combines the offset correction signal with the output of the quadrature detector to provide an offset adjusted signal at an output node. In tuning the detector, the control circuit sets the magnitude of the correction signal such that the magnitude of the offset adjusted signal is equal to some predetermined voltage when the frequency of the frequency modulated input signal is substantially equal to the center frequency of the system.

Further, the present invention provides for a sampler which is coupled to the output node. The sampler converts the offset adjusted signal into a sequence of samples, and the control circuit determines the proper correction signal in response to the sequence of samples.

According to one aspect, the sampler is comprised of an output buffer circuit which clamps the voltage swing of the offset adjusted signal and produces a first demodulated signal. The first demodulated signal may then be input to a comparator circuit which produces a second demodulated signal at TTL levels. This second demodulated signal may then be provided to the digital logic of the control circuit as an input which informs the control circuit in setting the magnitude of the correction signal.

In addition, the present invention provides a source of a training signal whose frequency is substantially equal to the center frequency of the overall system. A switch which periodically applies the training signal to the input of the quadrature detector is also provided. The control circuit is coupled to this switch and executes an algorithm to determine the proper correction signal whenever the training signal is supplied to the quadrature detector.

In one embodiment of the apparatus, the offset adjustment circuit is provided in integrated circuit form along with the quadrature detector, the output buffer circuit, and the comparator circuit. The digital logic and DAC of the control circuit are external to the integrated circuit.

In one implementation of the invention, the apparatus is part of a transmit/receive station in a system for the wireless transfer of frequency modulated information. The transmit/receive station includes an antenna, a transmit/receive switch, a transmitter, and a receiver which includes a quadrature detector circuit, an offset adjustment circuit, and a control circuit. The quadrature detector circuit, offset adjustment circuit, and control circuit operate as summarized above.

In an embodiment of this implementation, the transmit/receive station is coupled to a host computer, and the digital logic of the control circuit is comprised of a routine that is executed by the host computer to determine the proper correction signal. In this embodiment, the DAC is responsive to the routine. Further, this embodiment provides for a sampler which may consist of an output buffer circuit and a comparator circuit as discussed above. The sampler provides a sequence of samples as an input to the routine that is run by the host computer to determine the proper correction signal.

In addition, this embodiment of the transmit/receive station also includes a source of a training signal whose frequency is substantially equal to the center frequency of the overall system, and a switch which periodically applies the training signal to the input of the quadrature detector. The control circuit is coupled to this switch and the host computer executes the routine to determine the proper correction signal whenever the training signal is supplied to the quadrature detector.

Accordingly, an apparatus that compensates for any offset present in the input signal of a system that demodulates a frequency modulated input signal using a quadrature detector has been provided. This apparatus is free from the temperature and age drift problems inherent in manual adjustment of an RLC tuning circuit. Further, the apparatus is also free from the process quality and temperature sensitivity problems encountered in the prior art as a result of attempting to automatically adjust the reactance of the RLC circuit. Still further, the apparatus compensates for the offset in a frequency modulated input signal without the aid of significant frequency downconversion and its inherent space constraints and harmonics filtering problems.

Other aspects and advantages of the present invention can be seen upon review of the figures, the detailed description, and the claims which follow.

3. A BRIEF DESCRIPTION OF THE DRAWINGS

The figures illustrate the invention by way of example, and not limitation. Like references indicate similar elements.

Figure 8A:
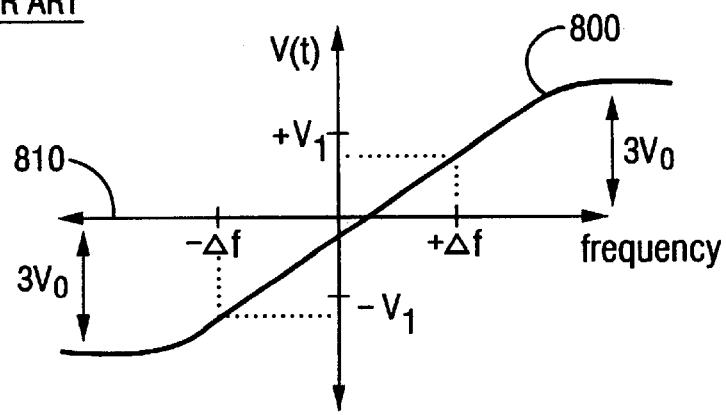
Figure 8B:
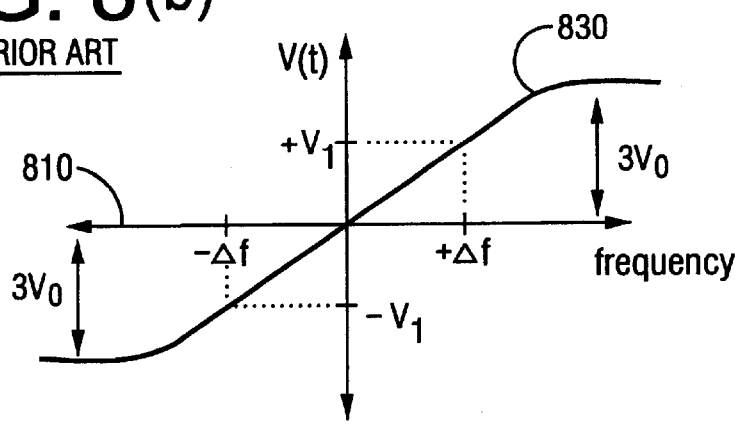

FIGS. 8(a) and 8(b) illustrate the effect on the output of a quadrature detector in the manually tuned detector in prior art systems.

Figure 8C:
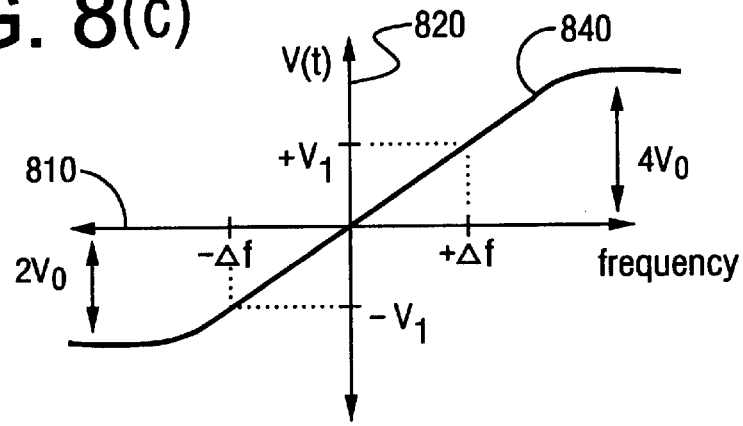

FIG. 8(c) illustrates the effect on the output of a quadrature detector tuned in the manner of one embodiment of the invention.

Figure 9:
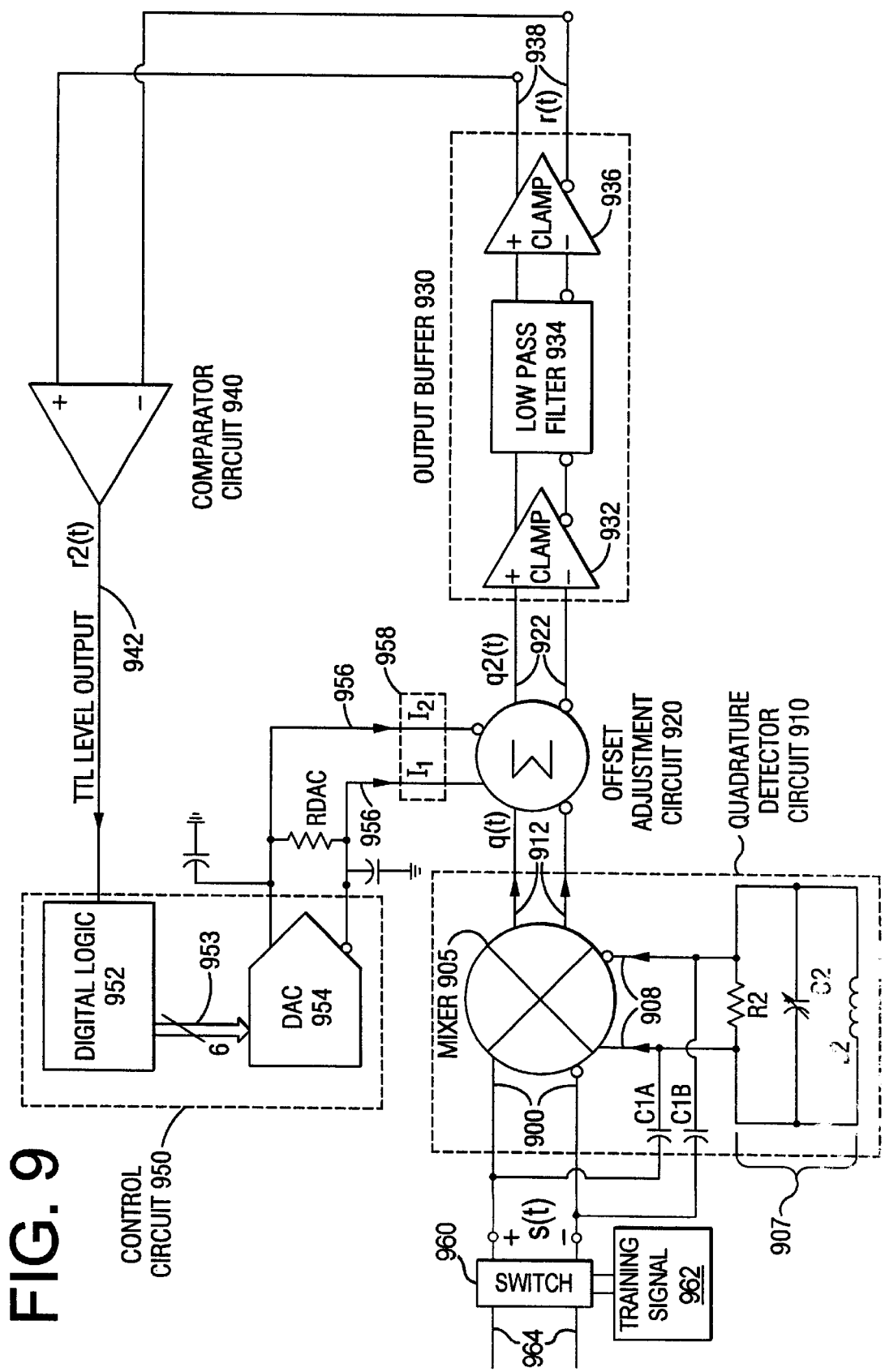

FIG. 9 illustrates, partially in block diagram form and partially in schematic form, an aggregate quadrature detector circuit according to one embodiment of the present invention.

Figure 10A:
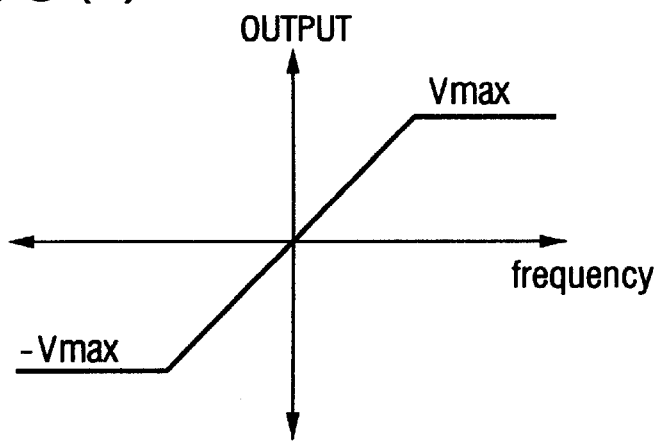
Figure 10B:
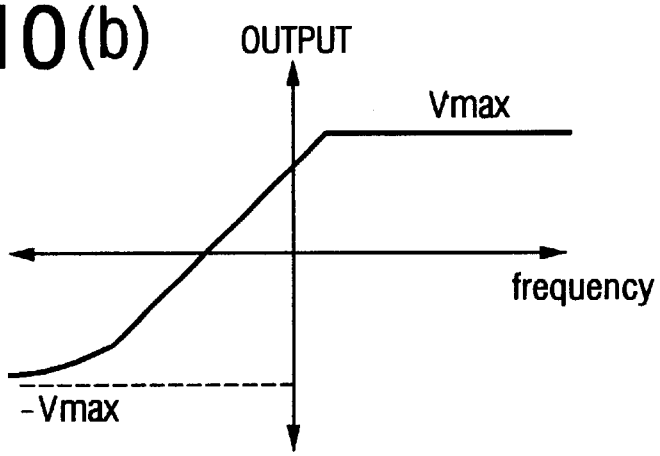
Figure 10C:
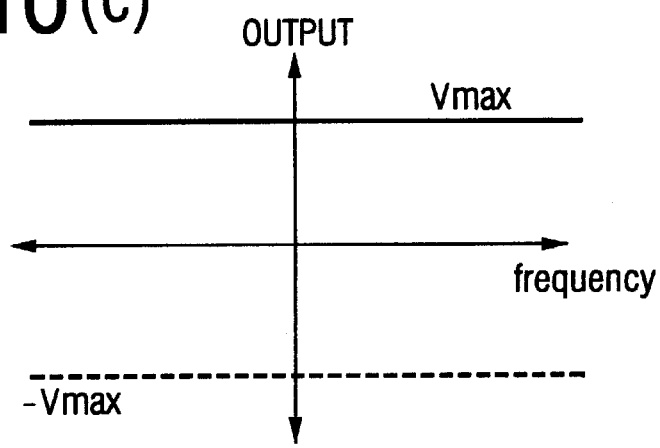

FIGS. 10(a)–(c) illustrate the output of an aggregate quadrature detector circuit according to one embodiment of the present invention under various conditions.

Figure 11:
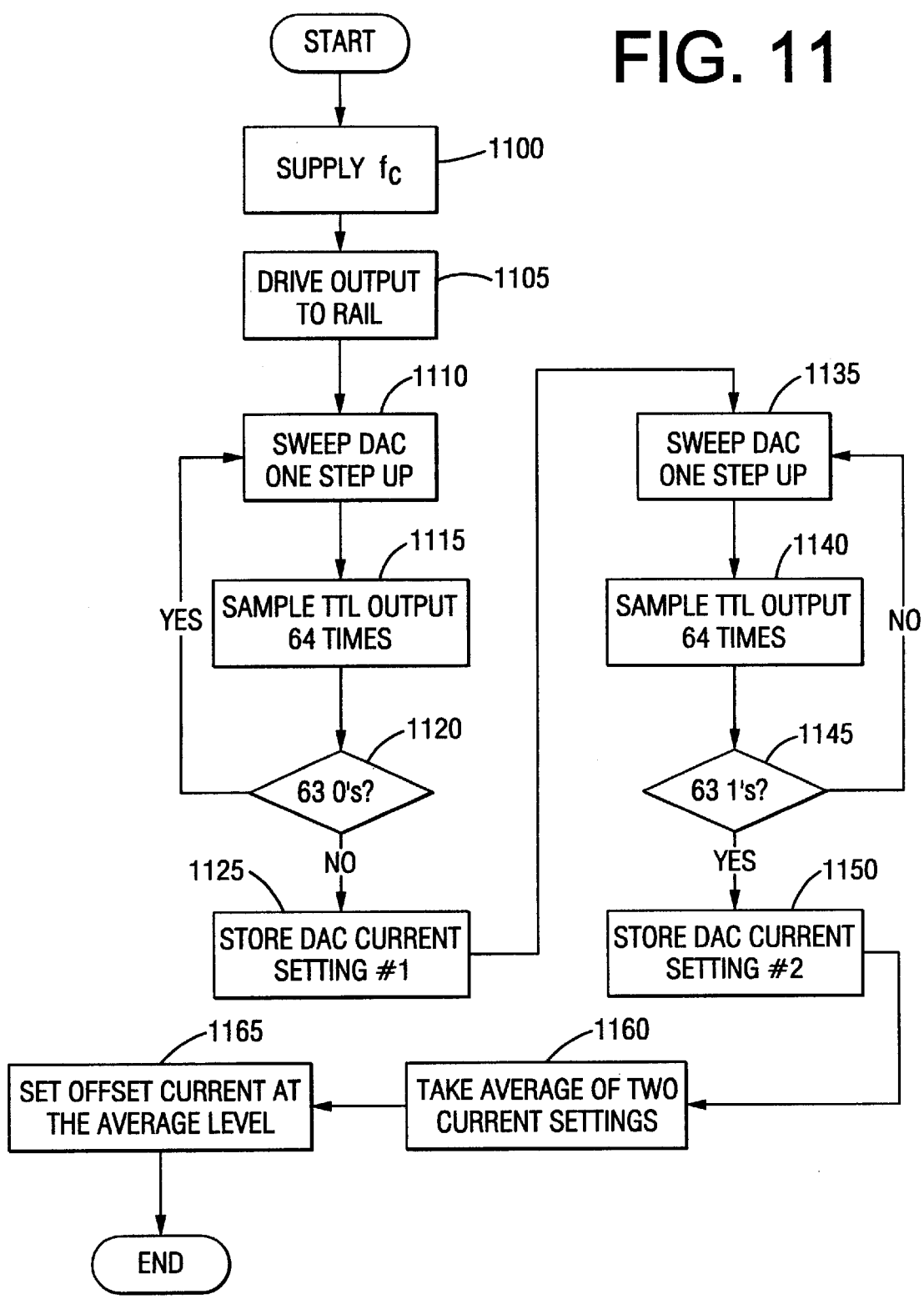

FIG. 11 illustrates an algorithm, in flowchart form, used to tune the output of a quadrature detector according to one embodiment of the invention.

Figure 12:
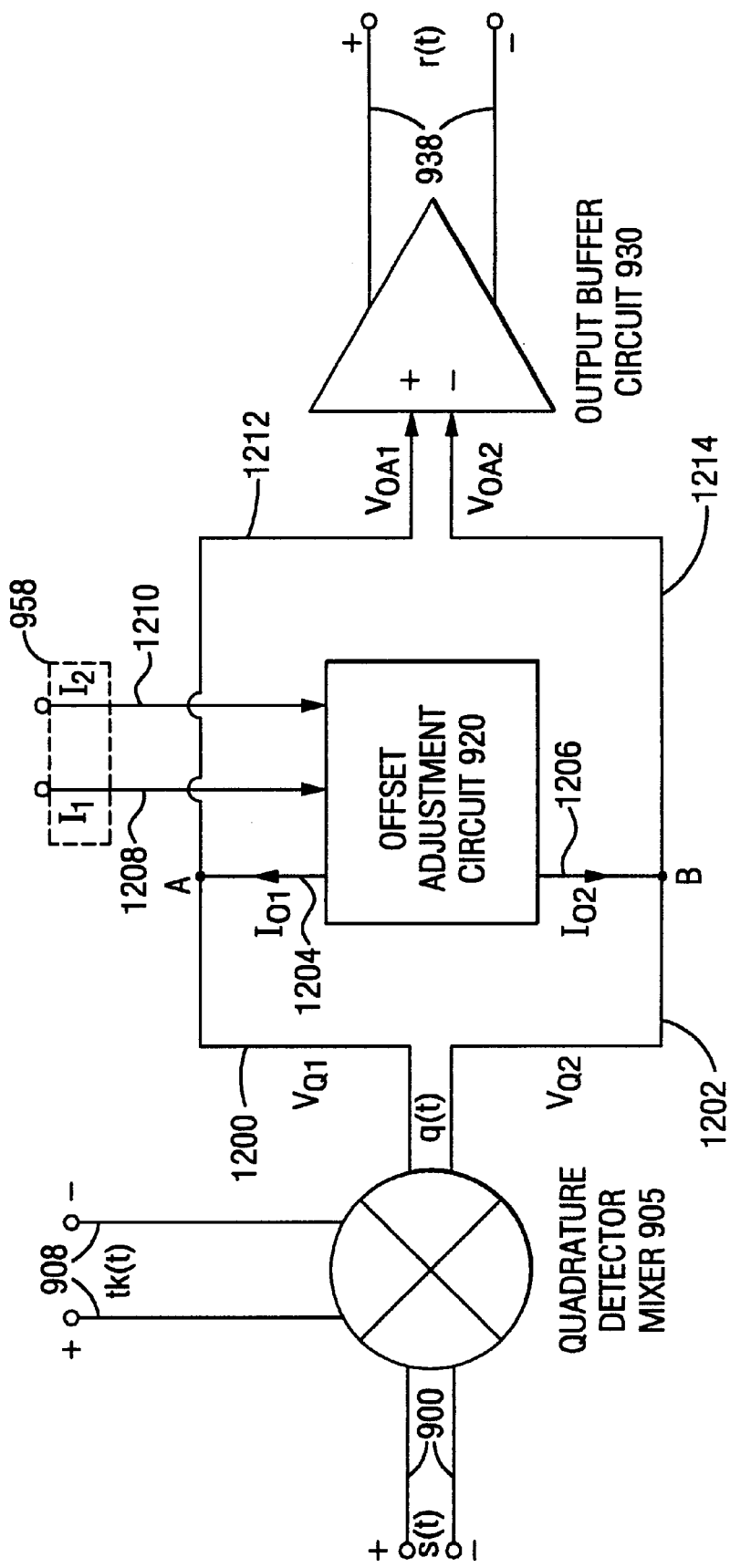

FIG. 12 illustrates in simplified block diagram form a portion of the aggregate quadrature detector circuit of FIG. 9.

Figure 13:
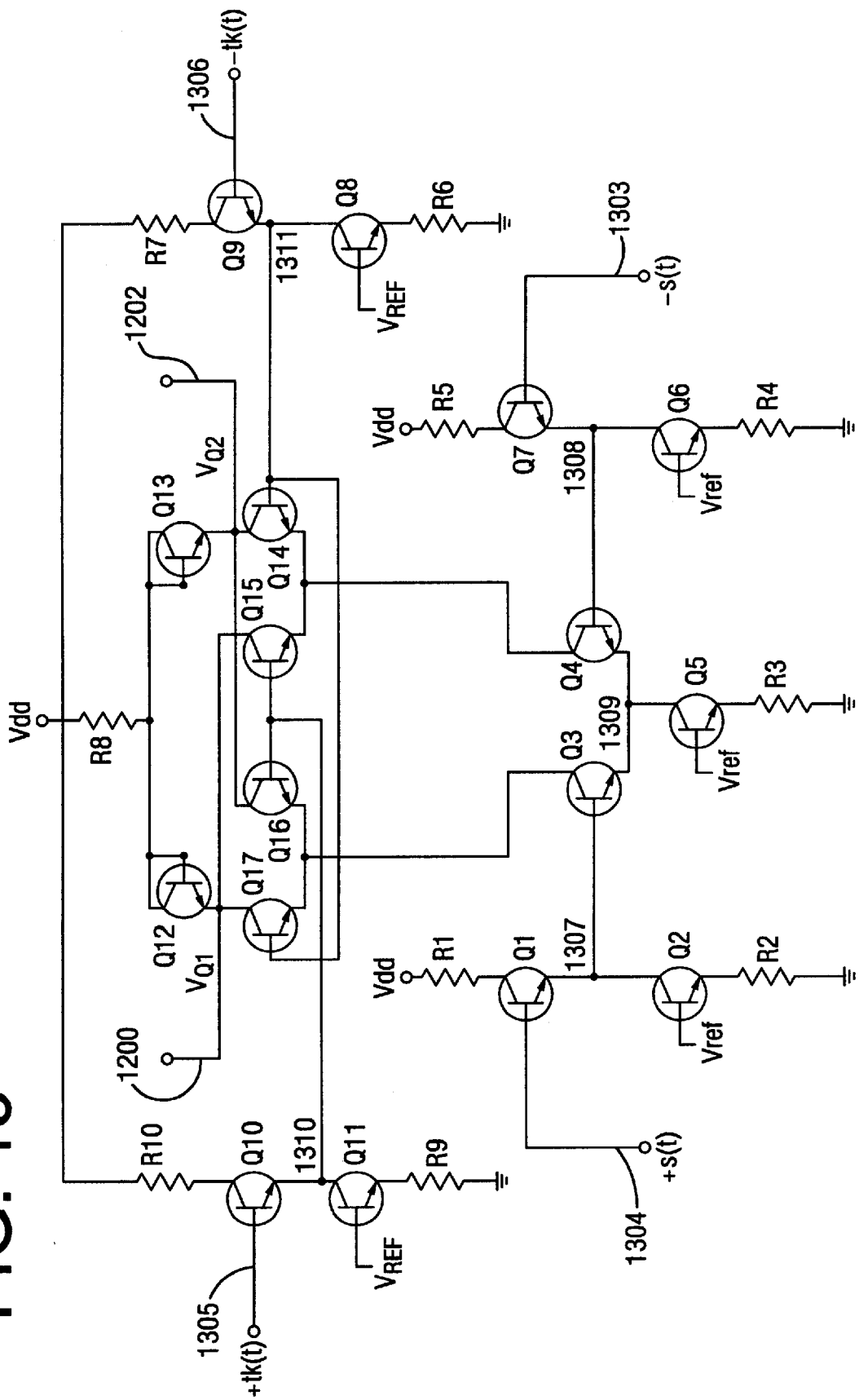

FIG. 13 is a circuit level schematic of a quadrature detctor circuit used in the circuits of FIGS. 9 and 12.

Figure 14:
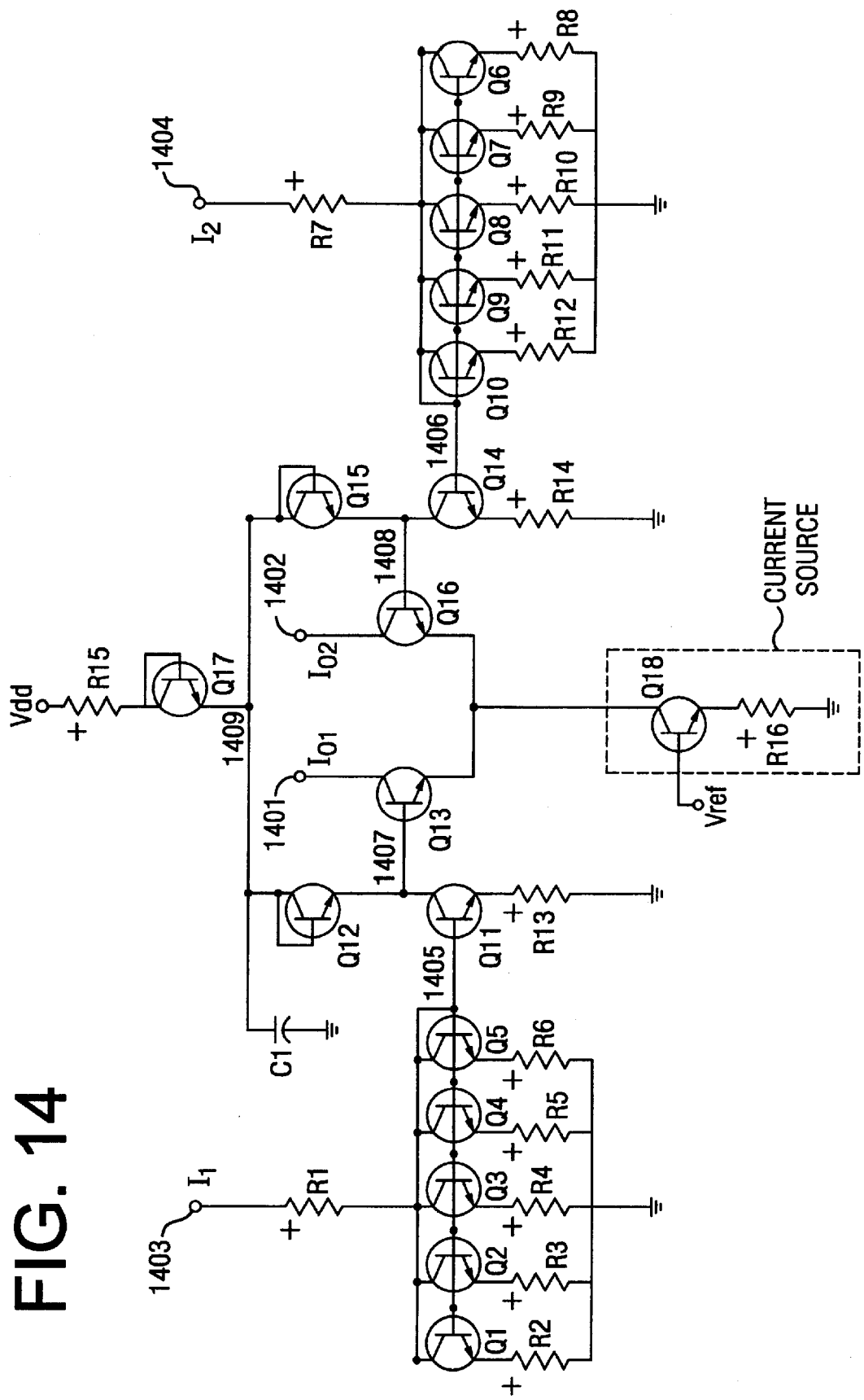

FIG. 14 is a circuit level schematic of an offset adjustment circuit used in the circuits of FIGS. 9 and 12.

Figure 15:
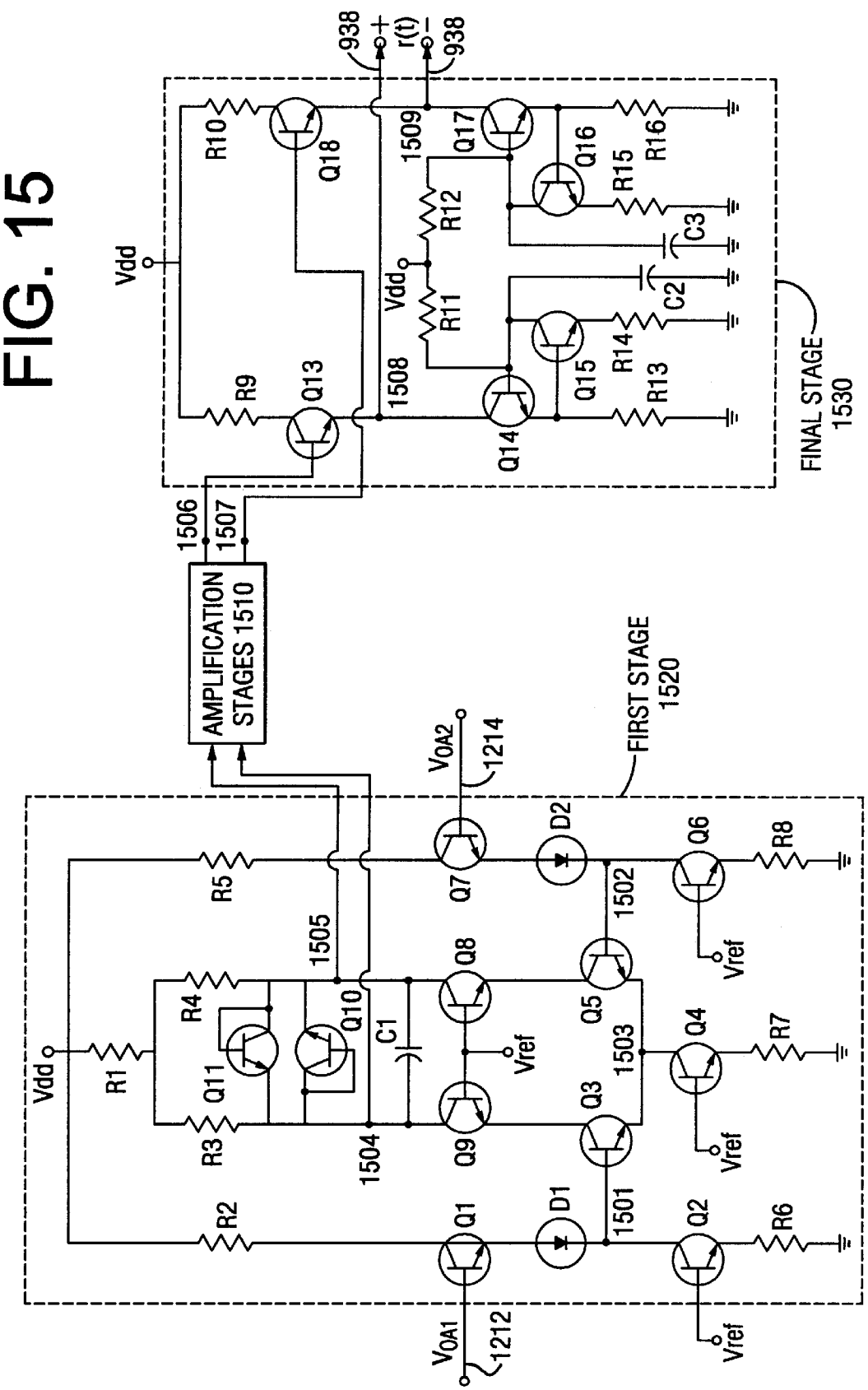

FIG. 15 is a circuit level schematic of the output buffer circuit used in the circuits of FIGS. 9 and 12.

Figure 16:
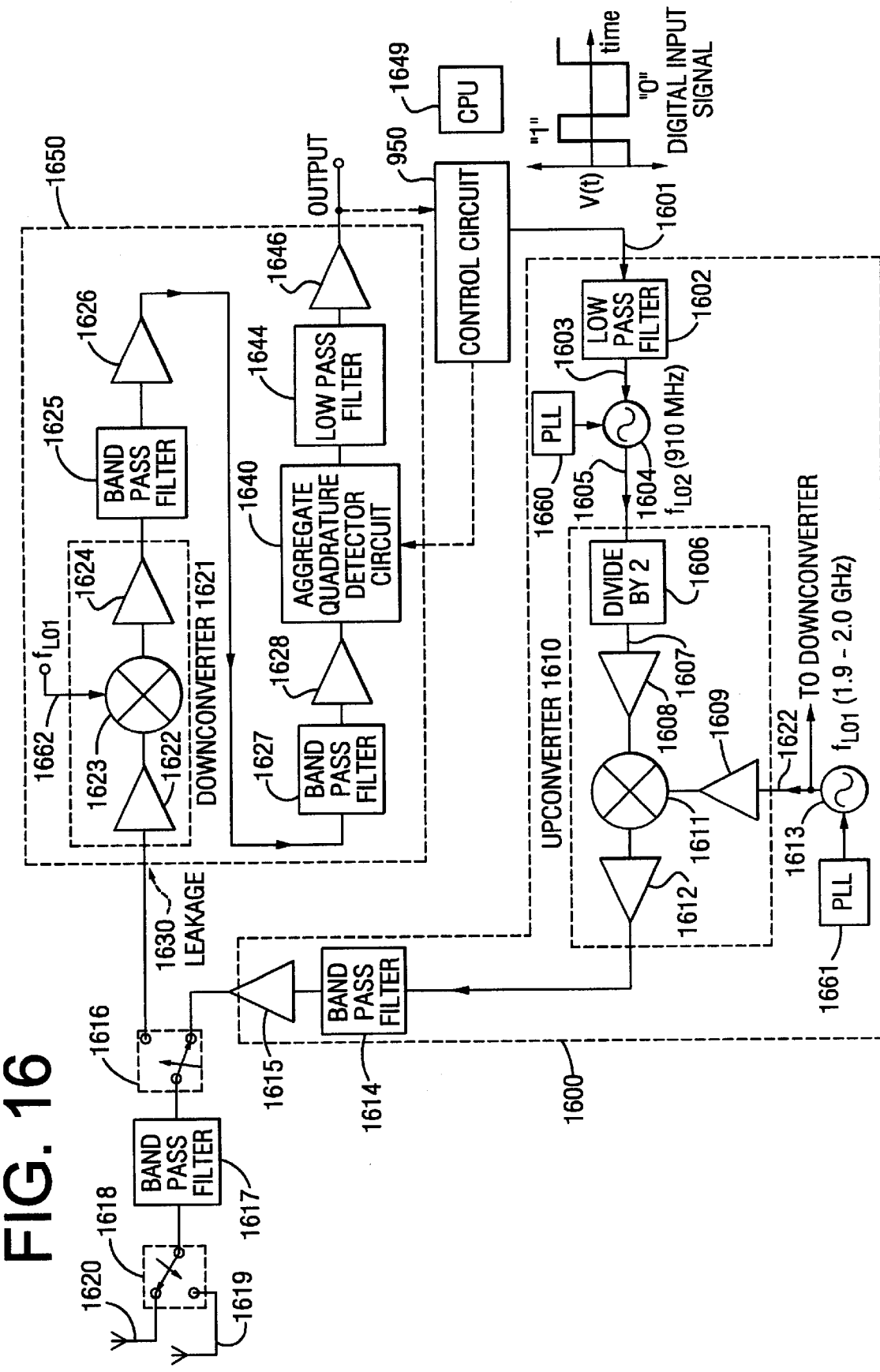

FIG. 16 illustrates, in block diagram form, a transmit/receive station of a wireless information system according to one embodiment of the present invention.

4. DETAILED DESCRIPTION

A detailed description of preferred embodiments is provided with respect to the Figures in which FIGS. 8(a)–(c) illustrate the difference in the effect on the output of a quadrature detector between manually tuning the detector and tuning the detector in the manner of one embodiment of the invention. As opposed to tuning the quadrature detector by moving the output curve 800 along the horizontal (frequency) axis 810 as done in the prior art and shown in FIG. 8(b) by manually tuned output curve 830, the present invention tunes the output of the quadrature detector by moving the output curve 800 along the vertical axis (output voltage) 820 of the output curve 800 as shown in FIG. 8(c) by voltage tuned output curve 840. Note that in tuning the output curve 800 in accord with the present invention the resultant voltage tuned output curve 840 is slightly asymmetrical with respect to the frequency axis 810, whereas the manually tuned output 830 is symmetrical. Thus, in tuning the quadrature detector in accord with the present invention, the resultant voltage tuned output curve 840 will have greater range in frequency in one direction, either above or below the ideal carrier center frequency depending on whether the mistuning was originally high or low. However, in an embodiment of the present invention, the range of frequency variation in the input to the quadrature detector is small compared to the quadrature detector's operating frequency range. This is done to ensure that the input signal remains in the linear range of operation of the curve.

FIG. 9 illustrates, partially in block diagram form and partially in schematic form, an aggregate quadrature detector circuit according to one embodiment of the present invention. A portion of this circuit that is indicated below is designed to be implemented in a bipolar integrated circuit. Other integrated circuit technologies such as CMOS could be applied as well. Notice that the circuit is in differential format. Differential mode operation eliminates many of the sources of error inherent in single-ended designs by taking advantage of matching of circuit elements.

As illustrated in FIG. 9, the aggregate quadrature detector circuit receives a frequency modulated input s(t) at lines 900. It is applied to a quadrature detector circuit 910 which has a mixer 905 which is on an integrated circuit, and a tuning circuit 907 which is located external to the integrated circuit. The input s(t) is received at one quadrant of the mixer 905, and also at the tuning circuit 907 after passing through capacitors C1A and C1B. The tuning circuit 907 consists of an RLC network with damping resistor R2, inductor L2, and variable capacitor C2 in a parallel configuration. The values of damping resistor R2, inductor L2 and capacitor C2 are chosen such that the output of the tuning circuit is a signal that is 90 degrees out of phase with input s(t). The tuning circuit is adjusted via variable capacitor C2 at the time of manufacture so that it is at least coarsely aligned with the system center frequency. While the circuit shown here is capable of operating over a broad range of center frequencies depending on the values chosen for resistor R2, inductor L2 and capacitor C2, this particular circuit was designed to operate at 455 MHZ. The output of the tuning circuit 907 is provided to a second input quadrant of the mixer 905. The mixer 905 acts to mix the input signal s(t) on lines 900 with the output of the tuning circuit on lines 908. The output q(t) of the quadrature detector circuit 910 on lines 912 is a voltage that is proportional to the frequency of the input s(t) as described previously. The slope of the voltage vs. frequency output q(t) of the quadrature detector circuit 910 is determined by the choice of external RLC network elements R2, L2 and C2. This is generally referred to in the art as varying the "Q" of the tuned circuit. Less slope (or sensitivity) results in less DC offset error when the circuit is not aligned, but also results in lower signal levels at the output for frequency varying inputs. A more detailed schematic of the quadrature detector circuit 910 is provided in FIG. 13 which is explained below.

FIG. 9 additionally illustrates a switch 960 connected with input s(t). The switch 960 can be used to selectively couple a source of a training signal 962 or another signal source 964 with the input s(t).

The output q(t) of the quadrature detector circuit 910 is received by the offset adjustment circuit 920 on lines 912. The offset adjustment circuit 920 also receives a differential correction current 958 as an input on lines 956. The correction current 958 is provided by the DAC 954 in a manner that will be described below. The offset adjustment circuit generates an offset current in response to the value of the differential correction current 958. The offset adjustment circuit 920 then combines the output q(t) with the offset current in order to correct the output q(t) for mistuning. The offset adjustment circuit 920 provides an offset adjusted signal q2(t) as an output on lines 922. When the aggregate quadrature detector circuit has been tuned, the value of the offset adjusted signal q2(t) on lines 922 is equal to zero when input s(t) is a continuous wave signal at the center frequency. The offset adjustment circuit 920 is located on the same integrated circuit as the quadrature detector mixer 905. A more detailed schematic of the offset adjustment circuit 920 is provided in FIG. 14 which is explained below.

The offset adjusted signal q2(t) is received by the output buffer circuit 930 on lines 922. The output buffer circuit 930 consists of a series of clipping amplifiers with a high gain represented by clamp 932, a low pass filter 934, and another series of high gain clipping amplifiers shown as clamp 936. The output r(t) of the output buffer circuit is provided on lines 938. As stated above, the output buffer circuit 930 functions as a clipping amplifier with a very high gain. Thus, once the offset adjusted signal q2(t) on lines 922—either by the quadrature detuning or by the adding of the offset current in the offset adjustment circuit 920—reaches some voltage +Vmax or −Vmax, the output r(t) of the output buffer circuit 930 on lines 938 remains flat. This is shown in FIGS. 10(a)–(c) which illustrate the output of the aggregate quadrature detector circuit of FIG. 9 under various conditions. FIG. 10(a) illustrates the output r(t) with no offset (ie., when the quadrature detector is tuned perfectly). FIG. 10(b) illustrates the output r(t) with an offset that is slightly high. FIG. 10(c) illustrates the output r(t) with an offset that drives the output to the rail high. The output buffer circuit 930 is located on the same integrated circuit as the offset adjustment circuit 920 and quadrature detector mixer 905. A more detailed schematic of the output buffer circuit 930 is provided in FIG. 15 which is explained below.

Figure 1:
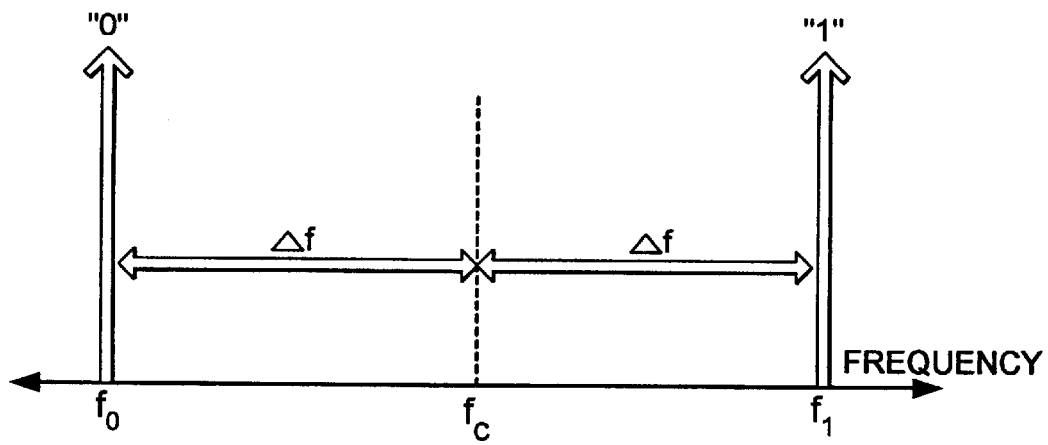
FIG. 1 illustrates frequency assignments in a typical binary FSK system.
Figure 2:
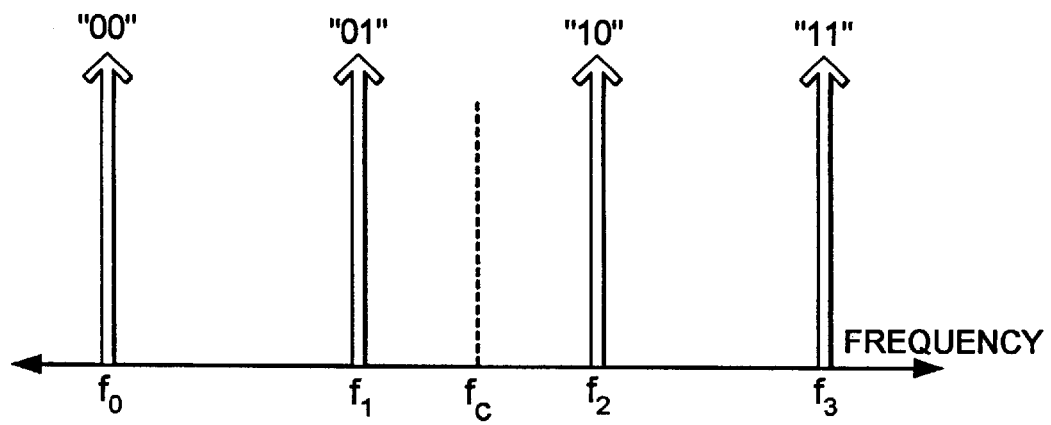
FIG. 2 illustrates prior art frequency assignments in an FSK system utilizing four tones to represent the possible bit combinations.
Figure 3:
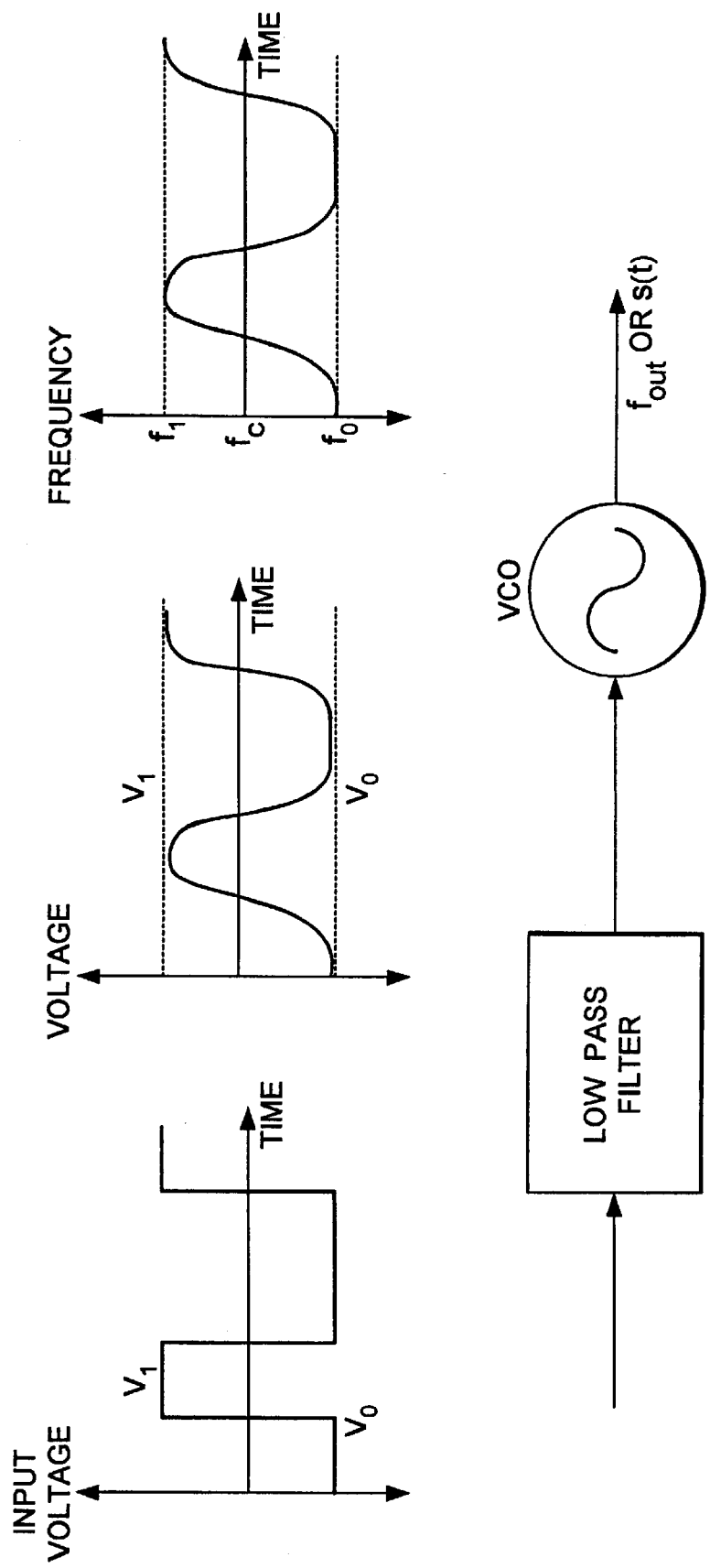
FIG. 3 illustrates the operation of a typical voltage controlled oscillator.
Figure 4:
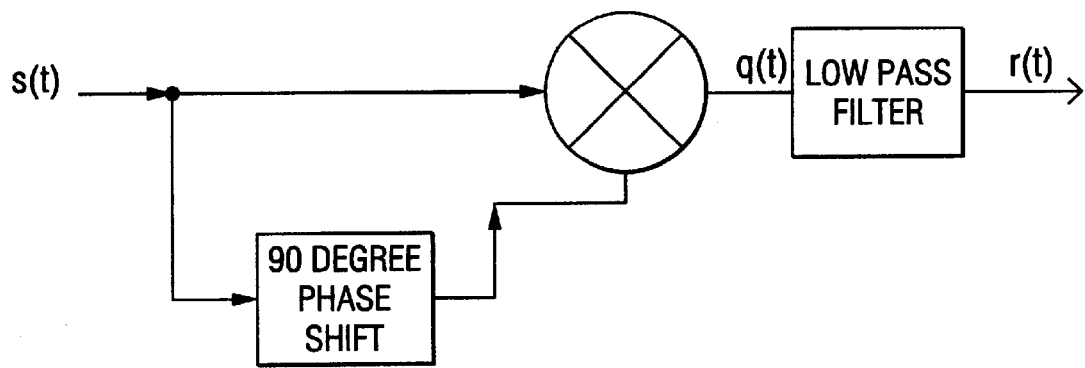
FIG. 4 illustrates a typical quadrature detector in block diagram form.
Figure 4:
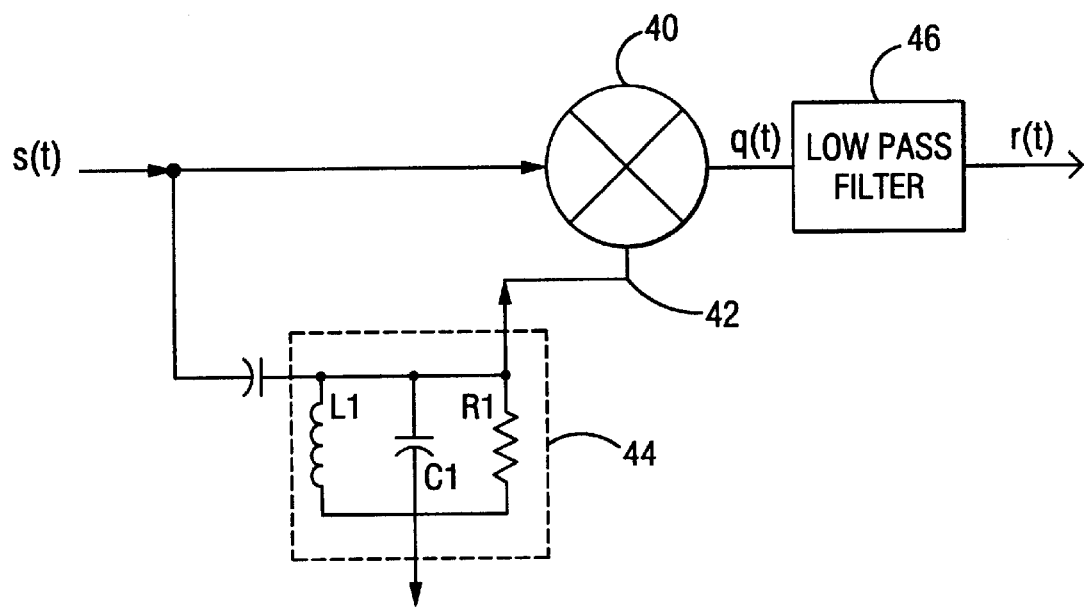
Figure 5:
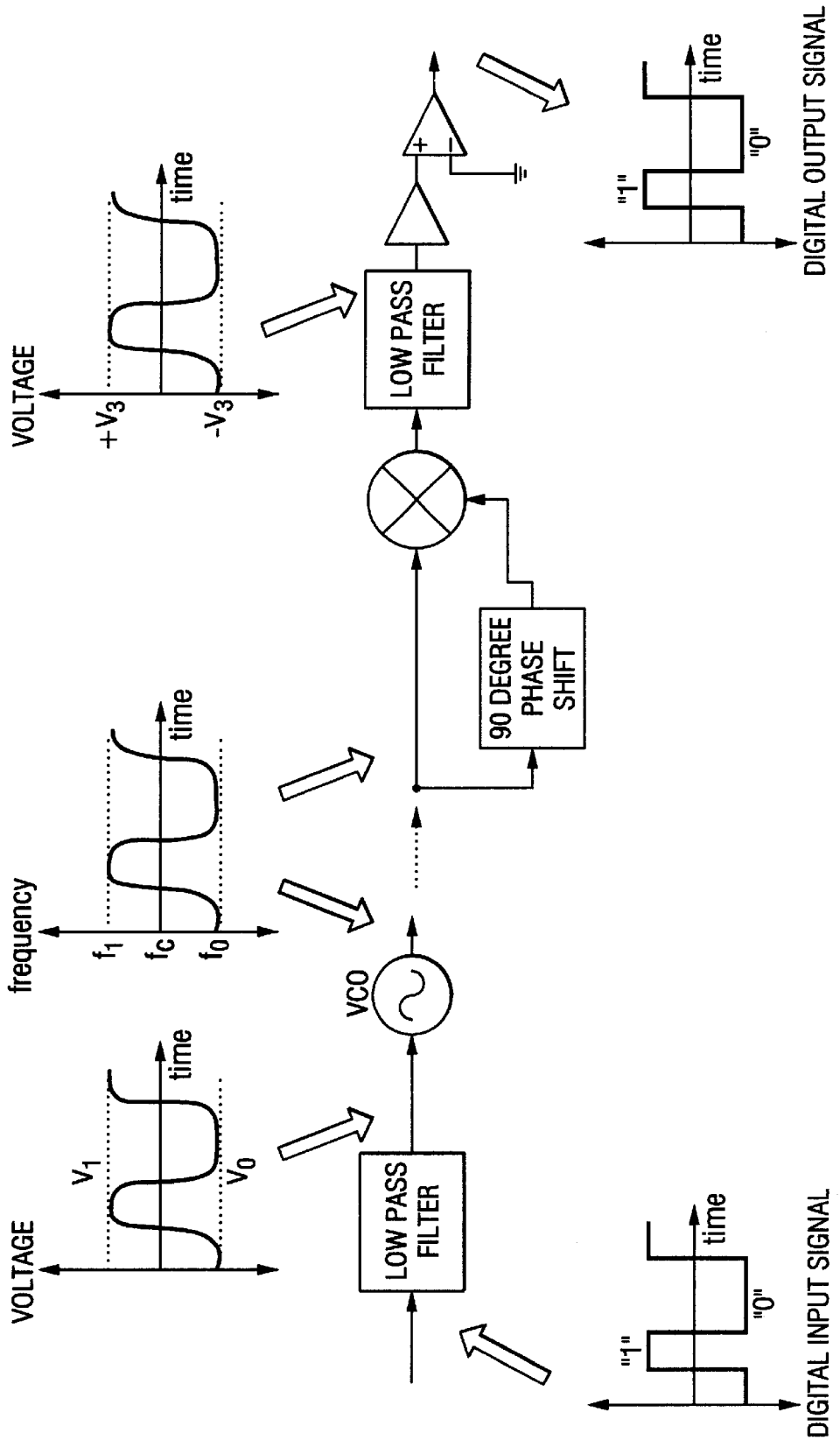
FIG. 5 illustrates the operation of a typical FSK information system, utilizing a voltage controlled oscillator and a quadrature detector, in block diagram form.
Figure 6:
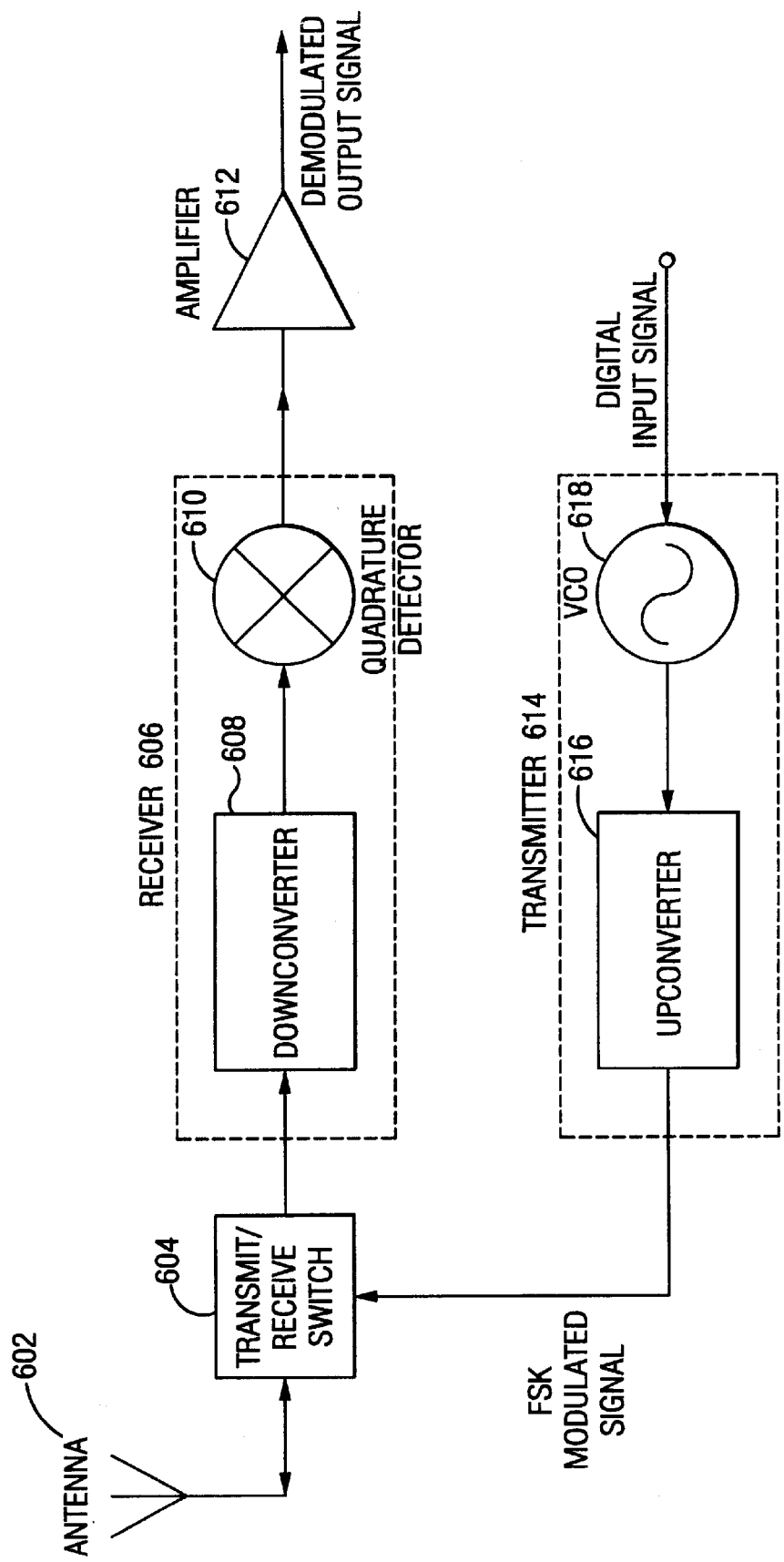
FIG. 6 illustrates a simple radio utilizing a quadrature detector in the demodulation path of the receiver, in block diagram form.
Figure 7:
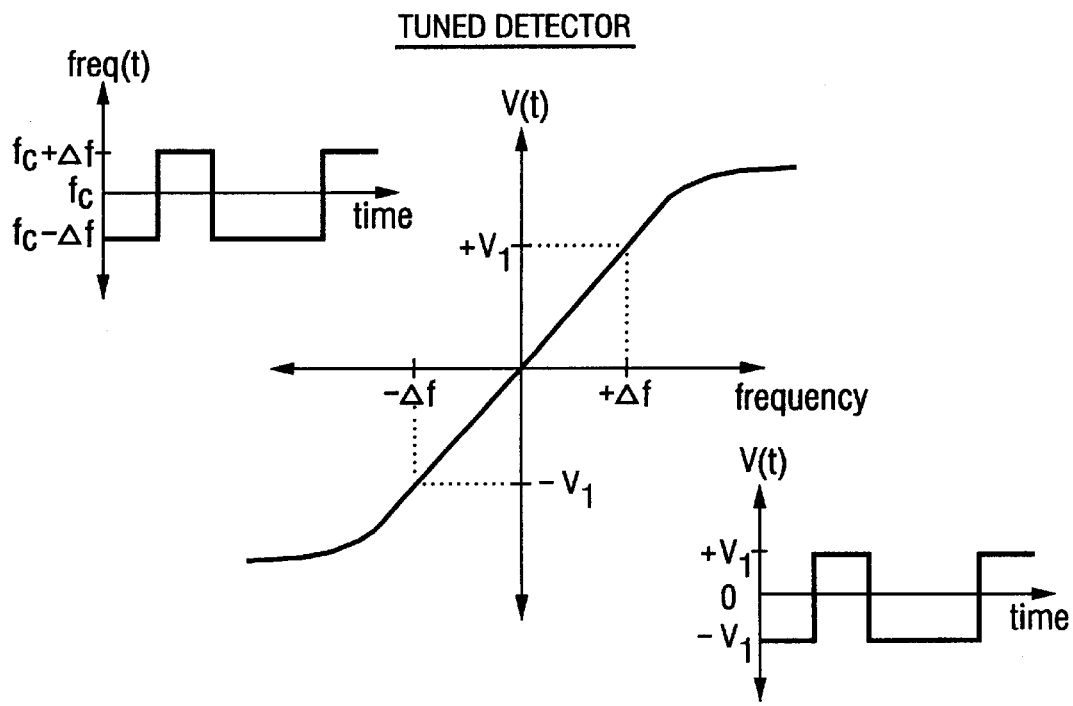
FIG. 7 illustrates the effects of tuning errors on the output of a quadrature detector in a prior art system.
Figure 7:
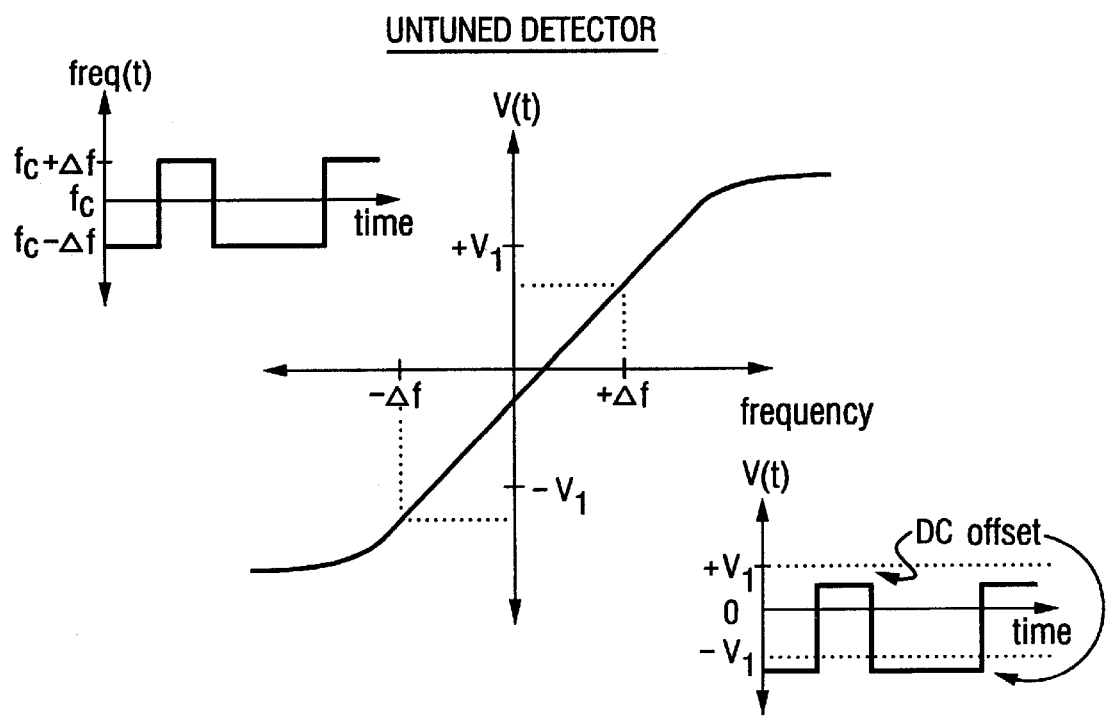

The output r(t) of the output buffer circuit 930 is received by the comparator circuit 940 on lines 938. The comparator circuit 940 consists of another series of high gain amplifiers and functions to convert the low level differential output r(t) into a TTL level, non-differential output signal r2(t). The comparator circuit is located on a separate integrated circuit than the one discussed above with respect to the quadrature detector 905, offset adjustment circuit 920 and output buffer 930. A more detailed description and schematic of the comparator circuit 940 is contained in U.S. Pat. No. 5,671,258 entitled "Clock Recovery Circuit and Receiver Using Same", and said patent is hereby incorporated by reference (See, for example, columns 6–8 and FIG. 3).

The output r2(t) of the comparator circuit is received by the digital logic 952 of the control circuit 950 on line 942. The control circuit 950 consists of a digital logic 952 and a DAC 954. In this embodiment of the invention, the digital logic 952 is implemented by the CPU of the host computer. The DAC 954 is a 6-bit DAC which receives digital control signals from the digital logic on bus 953. The digital logic 952 controls the output of the DAC 954 in order to set the correction current 958 on lines 956 such that when the offset current generated in response to the correction current 958 is combined with the output q(t) in the offset adjustment circuit 920 the value of the offset adjusted signal q2(t) on lines 922 is equal to zero when input s(t) is a continuous wave signal at the center frequency. The digital logic 952 performs an algorithm that is discussed below in reference to FIG. 11 to set the correction current 958. The 6-bit DAC 954 used in implementing this circuit was designed for a total output current of 1 milliamp divided into 64 possible incremental steps. The 1 milliamp of correction current 958 is split between currents $I_1$ and $I_2$ according to the amount and direction of tuning correction needed. For instance, when no correction was needed to tune the quadrature detector 910, the 1 milliamp of correction current 958 would be split nearly evenly between $I_1$ and $I_2$. When the digital logic 952 sends a signal to the DAC 954 for a particular correction current 958, the values of currents $I_1$ and $I_2$ vary accordingly between 0 and 1 milliamp. Note in FIG. 9 that resistor RDAC is connected across the current paths of $I_1$ and $I_2$. Placing this resistor RDAC here limits the maximum current excursions of $I_1$ and $I_2$ and thus allows for finer control of the correction current 958 and the offset current.

In one embodiment of the invention illustrated in FIG. 9, even slight DC offset errors will drive the output r(t) of the output buffer circuit 930 to either rail, due to the aforementioned high gain clipping action. The algorithm used by the digital logic 952 in one embodiment of the invention to set the correction current 958 takes advantage of this. Before discussing this algorithm however, it would be beneficial to discuss the effect of system noise on the output r(t). For, if a continuous wave signal were input to the aggregate quadrature detector circuit of FIG. 9, and there was no extraneous system noise present on that signal, then the output r(t) would consist of a DC signal. However, there is a certain amount of self-generated noise present in the circuits of this embodiment of the invention. Thus, the output r(t) would be a DC signal with gaussian noise, and this output would appear as a fuzzy line. This is important to note in that it makes finding the proper correction current 958 to zero the offset adjusted signal q2(t) and output r(t) difficult. If there were no noise it would be rather simple to determine when the output r(t) was at zero because of the previously discussed high gain clipping action of the output buffer circuit 930. This is because whenever above zero the output r(t) would be a positive number, and vice-versa whenever below zero. This is untrue in a noisy environment. For, positive noise spikes could cause the output r(t) to be positive even when the circuit is perfectly aligned. Thus, in a randomly noisy system a periodic sample of the output would result in a relatively equal mix of positive and negative outputs.

With this in mind, an algorithm used to tune the output of a quadrature detector according to one embodiment of the invention is illustrated in FIG. 11. At the start of the algorithm, a reference frequency is provided to the input s(t) of the aggregate quadrature detector circuit of FIG. 9 as indicated by block 1100. In one embodiment of the invention, this reference frequency is equal to the center frequency of the system and is provided by the leakage 1630 of a continuous wave signal from the transmitter 1600 of the overall system to the receiver 1650 as discussed later with respect to FIG. 16. Next, at block 1105, a correction current 958 is generated and combined with the output q(t) of the quadrature detector 910 that is sure to drive the output r(t) of the output buffer to its negative rail. In one embodiment this result is attained by the digital logic 952 sending a signal to the 6-bit DAC 954 consisting of a string of six 0's which thereby causes the lowest possible correction current 958 from the DAC 954. At block 1110, the DAC 954 is swept upward one level of the possible sixty-four levels for a 6-bit DAC thereby increasing the correction current 958. The TTL level output r2(t) of the comparator circuit 940 is then sampled 64 times by the digital logic 952 as indicated by block 1115. The sample is then interrogated at block 1120, and if 63 or more of the data points in the sample were 0's, then the digital logic 952 sends a new signal to the DAC 954 to sweep up another level and thereby increase the correction current 958. Another sample of the comparator output r2(t) is then performed and interrogated as before. As indicated in FIG. 11, this looping process continues until the output sample contains fewer than 63 0's.

When the interrogation of the sample reveals fewer then 63 0's, the digital logic 952 stores the 6-bit current signal as shown by block 1125, and continues to sweep the DAC 954 upwards as indicated at block 11135. A loop similar to the one explained above is then carried out. The output r2(t) of the comparator circuit 940 is sampled 64 times at block 1140 and then interrogated at block 1145. If the sample does not contain 63 or more 1's, then the digital logic 952 sends a new signal to the DAC 954 to sweep up another level and thereby increase the correction current 958. Another sample of the comparator output r2(t) is then performed and interrogated as before. As indicated in FIG. 11, this looping process continues until the output sample contains at least 63 1's. When the interrogation of the sample reveals at least 63 1's, the digital logic 952 stores the 6-bit current signal as shown by block 1150. The digital logic 952 then takes an average of the two stored 6-bit current signals as indicated by block 1160. At step 1165, finally, the digital logic 952 sets its 6-bit current signal to the determined average to complete the process.

At this point the continuous wave reference frequency no longer needs to be applied. In order to keep the quadrature detector properly tuned over time this sequence could be performed periodically. In one embodiment of the invention illustrated in FIG. 16 to be described later, this algorithm is repeated at regular intervals of from 200 milliseconds to 2 seconds, and in coordination with an overall system check signal, or heartbeat signal.

In an alternate embodiment of the algorithm discussed above one could determine the correction current 958 by altering the algorithm slightly to first drive the outputs r(t) and r2(t) positive and then step the DAC 954 in a downward manner. In another alternate embodiment of the algorithm one could sample the output r2(t) of the comparator circuit 940 until the sample at a particular DAC level consists substantially of an equal number of ones and zeros. Assuming random noise, this DAC level would be roughly equal to the level needed for perfect tuning. Another alternate embodiment of this algorithm would be to start sweeping the DAC 954 from a level other than the lowest or the highest level. In this manner the algorithm would run more quickly if the quadrature detector's initial manual tune was close to the center frequency. If the first sample did not contain at least 63 0's or 63 1's, then the digital logic 952 would send a second control signal representing either the lowest or the highest possible correction current respectively.

FIG. 12 illustrates in simplified block diagram form a portion of the differential aggregate quadrature detector circuit of FIG. 9. The elements of the circuit illustrated in FIG. 12 were designed to be implemented in a bipolar integrated circuit. The quadrature detector mixer 905 receives a frequency modulated input s(t) at lines 900 as described previously with respect to FIG. 9. The 90 degree phase shifted output tk(t) of the tuning circuit 907 of FIG. 9 is also received by the mixer 905 at lines 908. The mixer 905 mixes these inputs and produces differential output q(t). The differential output q(t) consists of quadrature output signals $V_{Q1}$ at line 1200 and $V_{Q2}$ at line 1202. The offset adjustment circuit 920 receives the correction current 958 from the DAC 954 of FIG. 9. The correction current 958 consists of correction current signal $I_1$ at line 1208 and correction current signal $I_2$ at line 1210. As described later with respect to FIG. 14, the offset adjustment circuit 920 generates offset current $I_{O1}$ at line 1204 and offset current $I_{O2}$ at line 1206 in response to the values of $I_1$ and $I_2$ Quadrature output signal $V_{Q1}$ is combined with offset current $I_{O1}$ at node A to produce offset adjusted signal $V_{OA1}$ at line 1212. Quadrature output signal $V_{Q2}$ is combined with offset current $I_{O2}$ at node B to produce offset adjusted signal $V_{OA2}$ at line 1214. The output buffer circuit 930 receives the offset adjusted voltage signals $V_{OA1}$ and $V_{OA2}$ at lines 1212 and 1214 respectively. With these inputs, the output buffer circuit 930 produces an amplified and clipped output signal r(t) at lines 938 as described previously with respect to FIG. 9. The quadrature detector circuit 910 of FIG. 9 and FIG. 12 is described below in reference to FIG. 13 which illustrates the circuit at a schematic level as implemented in one embodiment of the invention. As previously discussed, the quadrature detector 910 mixes a frequency modulated signal s(t) with a signal tk(t) that is 90 degrees out of phase with s(t) in order to produce a demodulated output q(t) that has a voltage that is proportional to the frequency of s(t) over a given frequency range. As the quadrature circuit 910 is illustrated in FIG. 13 in differential form according to one embodiment of the invention, the input signals s(t) and tk(t) are illustrated as each having a positive and a negative component. The circuit receives the positive component of signal s(t) at line 1304 at the base of transistor Q1. The negative component of signal s(t) is received at line 1303 at the base of transistor Q7. Transistors Q1 and Q7 are configured as emitter followers and serve as buffers for these input signals. The collector of transistor Q1 is connected to Vdd through resistor R1 and the emitter of transistor Q1 is connected to node 1307 and the collector of current source transistor Q2. Transistor Q2 receives a biasing voltage Vref at its base and the emitter of transistor Q2 is connected to ground through resistor R2. The collector of transistor Q7 is connected to Vdd through resistor R5 and the emitter of transistor Q7 is connected to node 1308 and the collector of current source transistor Q6. Transistor Q6 receives a biasing voltage Vref at its base and the emitter of transistor Q6 is connected to ground through resistor R4. Node 1307 is connected to the base of transistor Q3, and the emitter of transistor Q3 is connected to node 1309. The collector of transistor Q3 is connected to the emitters of transistors Q16 and Q17. Node 1308 is connected to the base of transistor Q4, and the emitter of transistor Q4 is connected to node 1309. The collector of transistor Q4 is connected to the emitters of transistors Q14 and Q15. Node 1309 is connected through the collector of current source transistor Q5 and resistor R3 to ground. The base of transistor Q5 is biased by voltage Vref.

The positive component of signal tk(t) is received at line 1305 at the base of transistor Q10. The negative component of signal tk(t) is received at line 1306 at the base of transistor Q9. Transistors Q9 and Q10 are configured as emitter followers and serve the same buffering function as transistors Q1 and Q7. The collector of transistor Q10 is connected to Vdd through resistor R10 and the emitter of transistor Q10 is connected to node 1310 and the collector of current source transistor Q11. Transistor Q11 receives a biasing voltage Vref at its base and the emitter of transistor Q11 is connected to ground through resistor R9. The collector of transistor Q9 is connected to Vdd through resistor R7 and the emitter of transistor Q9 is connected to node 1311 and the collector of current source transistor Q8. Transistor Q8 receives a biasing voltage Vref at its base and the emitter of transistor Q8 is connected to ground through resistor R6. Node 1310 is connected to the base of transistors Q15 and Q16, and node 1311 is connected to the base of transistors Q14 and Q17.

The positive component $V_{Q1}$ of the output signal q(t) is illustrated at line 1200. This is also shown in FIG. 12. Line 1200 is connected to the emitter of transistor Q12 which is configured as a diode load. Diode loads were used in place of resistor loads in the circuit in order to increase the speed of the circuit's response time. The base and collector of transistor Q12 is connected to Vdd through resistor R8. Line 1200 is further connected to the collectors of transistors Q15 and Q17. The negative component $V_{Q2}$ of the output signal q(t) is illustrated at line 1202. Line 1202 is connected to the emitter of transistor Q13 which is also configured as a diode load. The base and collector of transistor Q13 is connected to Vdd through resistor R8. Line 1202 is further connected to the collectors of transistors Q14 and Q16.

The circuit as described above is designed to output a differential voltage of zero when the circuit is perfectly tuned and the input signal s(t) is at the center frequency. The circuit performs this through the action of transistors Q14, Q15, Q16, Q17, Q3 and Q4 which function as a Gilbert mixing circuit. This Gilbert cell acts as a four quadrant multiplier to multiply the four input signals such that they cancel each other out when tk(t) is exactly 90 degrees out of phase with s(t) when s(t) is at the center frequency of the system, thus giving an output voltage of zero for the detector circuit. Further, due to the differential nature of the circuit, the output voltage q(t) of the circuit does not change whenever offset currents $I_{O1}$, and $I_{O2}$ are equal. Currents $I_{O1}$ and $I_{O2}$ from the offset adjustment circuit 920 are combined with the out put voltages $V_{Q1}$ and $V_{Q2}$ of the quadrature detector 910 at nodes A and B as shown previously in FIG. 12. When the circuit is tuned and the offset currents $I_{O1}$ and $I_{O2}$ are equal as will be described later with respect to FIG. 14, their combination with $V_{Q1}$ and $V_{Q2}$ at nodes A and B has no effect on the differential output voltage q(t) of the quadrature detector 910. The only effect on the quadrature detector 910 that offset currents $I_{O1}$ and $I_{O2}$ would have when they are equal is to cause the DC offsets across diode connected transistors Q12 and Q13 to vary in an equal manner, and since the circuit is differential this effect is canceled out.

FIG. 14 is a circuit level schematic of a current offset circuit used in the circuit of FIG. 9. Component $I_1$ of correction current 958 is received by the offset adjustment circuit at node 1403 from the DAC 954. $I_1$ is provided through resistor R1 to a group of transistors connected together in diode configuration to create a current mirror. Thus, $I_1$ is connected through resistor R1 to the collectors of transistors Q1, Q2, Q3, Q4 and Q5 whose collectors are connected at node 1405. Resistor R1 is a small resistor of about 200 ohms that is utilized by the circuit to damp out parasitic frequency resonances caused by oscillating transistors. The emitters of transistors Q1, Q2, Q3, Q4 and Q5 are connected to ground through resistors R2, R3, R4, R5 and R6 respectively. The bases of transistors Q1, Q2, Q3, Q4 and Q5 are also connected together at node 1405.

Node 1405 is connected to the base of transistor Q11 and the emitter of transistor Q11 is grounded through resistor R13. The collector of transistor Q11 is connected to node 1407 and to the base of transistor Q13. The emitter of transistor Q13 is connected to the collector of current source connected transistor Q18. The base of transistor Q18 is biased by Vref and the emitter of transistor Q18 is connected to ground through resistor R16. Offset current $I_{O1}$, which is shown as an output of the circuit at node 1401 is provided from the collector of transistor Q13. Node 1407 is further connected to the emitter of diode connected transistor Q12. The base and collector of transistor Q12 are connected together at node 1409 and the node 1409 is connected to the emitter of diode connected transistor Q17. The base and collector of transistor Q17 are connected together to Vdd through resistor R15.

Component $I_2$ of correction current 958 is received by the offset adjustment circuit at node 1404 from the DAC 954. $I_2$ is provided through resistor R7 to a group of transistors connected together in diode configuration to create a current mirror. Thus, $I_2$ is connected through resistor R7 to the collectors of transistors Q6, Q7, Q8, Q9 and Q10 whose collectors are connected at node 1406. Resistor R7 is used for the same damping as resistor R1. The emitters of transistors Q6, Q7, Q8, Q9 and Q10 are connected to ground through resistors R8, R9, R10, R11 and R12 respectively. The bases of transistors Q6, Q7, Q8, Q9 and Q10 are also connected together at node 1406.

Node 1406 is connected to the base of transistor Q14 and the emitter of transistor Q14 is grounded through resistor R14. The collector of transistor Q14 is connected to node 1408 and to the base of transistor Q16. The emitter of transistor Q16 is connected to the collector of current source connected transistor Q18. Offset current I02 which is shown as an output of the circuit at node 1402 is provided from the collector of transistor Q16. Node 1408 is further connected to the emitter of diode connected transistor Q15. The base and collector of transistor Q15 are connected together at node 1409 and the node 1409 is connected to the emitter of diode connected transistor Q17. Also connected to node 1409 is capacitor C1 which serves as a parasitic capacitance to suppress unwanted frequency signals and harmonics.

The circuit utilizes the double current mirror configuration of the diode connected transistor networks described above, and a differential amplifier defined by transistors Q13 and Q16 in conjunction with current source connected transistor Q18, to produce offset currents $I_{O1}$ and $I_{O2}$ such that they maintain the same ratio as the inputs $I_1$ and $I_2$ which represent the aforementioned correction current 958 from the DAC 954. Further, by using a number of transistors in the network, the effect of identical transistors with slight fabrication differences is minimized with respect to the accuracy of the ratio maintenance at the output.

FIG. 15 illustrates a single amplification stage and the final stage of the output buffer circuit 930 that is used in the circuit of FIG. 9. The output buffer circuit 930 receives differential signals $V_{OA1}$ and $V_{OA2}$ at lines 1212 and 1214 from the offset adjustment circuit 920 and quadrature detector 905 as also shown in FIG. 12. Input $V_{OA1}$ is received by the base of transistor Q1 which is configured as an emitted follower and used to buffer the input signal by dropping the signal level. The collector of transistor Q1 is connected to Vdd through resistor R2, and the emitter of transistor Q1 is connected to Vdd through resistor R2, and the emitter of transistor Q1 is connected to node 1501 through diode D1. Diode D1 server to further drop the DC level of the input signal prior to amplification. Node 1501 server to further drop the DC level of the input signal prior to amplification. Node 1501 is connected to the collector of current source configured transistor Q2 that is biased at its base by voltage Vref. The emitter of transistor Q2 is connected to ground through resistor R6. Node 1501 is also connected to the base of transistor Q3. Input $V_{OA2}$ is received by the base of transistor Q7 which is configured as an emitter follower and used to buffer the input signal by dropping the signal level. The collector of transistor Q7 is connected to Vdd through resistor R5, and the emitter of transistor Q7 is connected to node 1502 through diode D2. Diode D2 serves the same function as diode D1. Node 1502 is connected to the collector of current source configured transistor Q6 that is biased at its base by voltage Vref. The emitter of transistor Q6 is connected to ground through resistor R8. Node 1502 is also connected to the base of transistor Q5.

Transistors Q3 and Q5 serve as a differential amplifier to boost the gain of the differential input signal. The emitter of transistor Q3 and the emitter of transistor Q5 are connected to the collector of a current source configured transistor Q4. Transistor Q4 is biased by a Vref voltage signal at its base and is connected to ground at its emitter through resistor R7. The collector of transistor Q3 is connected to the emitter of Cascade connected transistor Q9, and the collector of transistor Q5 is connected to the emitter of cascode is connected transistor Q8. The bases of Cascade connected transistors Q8 and Q9 are connected and supplied with a bias voltage Vref. Cascade connected transistors Q8 and Q9 are designed to speed up the function of the circuit by providing very low impedance junctions such that transistors Q3 and Q5 can more easily dump their collector currents.

The collectors of transistors Q8 and Q9 are coupled to a capacitor C1 that provides some lowpass filtering action in conjunction with R3 and R4. The collectors of transistors Q8 and Q9 are similarly coupled across diode connected transistors Q10 and Q11. The collector of transistor Q9 is connected to the collector of transistor Q10 and the emitter of transistor Q11. The collector of transistor Q8 is connected to the emitter of transistor Q10 and the collector of transistor Q11. The collector of transistor Q10 is connected to the base of transistor Q10, and the collector of transistor Q11 is connected to the base of transistor Q11. Diode connected transistors Q10 and Q11 serve to limit the total amplification of the stage when the voltage gets high enough to turn on one of the diode connected transistors. In practice, these diode connected transistors Q10 and Q11 clip the voltage increase of the stage at about 0.8–0.85 volts. The collectors of transistors Q9 and Q8 are also coupled to Vdd through resistors R1 and R3, and R1 and R4 respectively. The output of the first amplification stage is provided at nodes 1504 and 1505 and is received at block 1510 which represents further stages of a similar amplification sequence consisting of buffering the signal, boosting the signal, cleaning up the signal, and limiting the stage amplification.

At the final stage 1530 of the output buffer 930 a bias resistor independent current mirror is utilized to make the output less dependent upon outside power supplies such as those used for the reference bias voltages shown in the first stage 1520. One advantage of the current mirror utilized in the final stage 1530 is its characteristic of decreasing current when the temperature of the circuit rises.

The inputs to the final stage are received at nodes 1506 and 1507. Node 1506 is connected to the base of transistor Q13 which is configured as an emitter follower and serves to buffer the input signal. The collector of transistor Q13 is connected to Vdd through resistor R9. The emitter of the transistor Q13 is connected to output node 1508 and the collector of current driving transistor Q14. The base of transistor Q14 is connected to Vdd is through resistor R11. The emitter of transistor Q14 is connected to the base of transistor Q15 and also to ground through resistor R13. The base of transistor Q14 is further connected to the collector of transistor Q15. The emitter of transistor Q15 is connected to ground through resistor R14. A capacitor C2 is connected between ground and the base of transistor Q14 in order to provide a parasitic capacitance to remove unwanted frequency signals.

Node 1507 is connected to the base of transistor Q18 which is configured as an emitter follower and serves to buffer the input signal. The collector of transistor Q18 is connected to Vdd through resistor R10. The emitter of the transistor Q18 is connected to output node 1509 and the collector of current driving transistor Q17. The base of transistor Q17 is connected to Vdd through resistor R12. The emitter of transistor Q17 is connected to the base of transistor Q16 and also to ground through resistor R16. The base of transistor Q17 is further connected to the collector of transistor Q16. The emitter of transistor Q16 is connected to ground through resistor R15. A capacitor C3 is connected between ground and the base of transistor Q14 in order to provide a parasitic capacitance to remove unwanted frequency signals.

The differential output signals are provided on nodes 1508 and 1509 to lines 938 as also shown in FIG. 9. In this embodiment of the invention the current values on lines 938 are equivalent. The output voltage signal r(t) is then provided to the comparator circuit for further processing as shown in FIG. 9 and discussed above.

FIG. 16 illustrates, in block diagram form, a transmit/receive station of a wireless information system which employs a quadrature detector according to one embodiment of the present invention. The transmit/receive station contains a transmitter 1600, a receiver 1650, a control circuit 950, a transmit/receive switch 1616, an antenna switch 1618, and antennas 1619 and 1620. The transmitter 1600 receives an input v(t) on line 1601. This input may be provided directly from the control circuit 950 as shown. The control circuit 950 utilizes the CPU 1649 of a host computer to provide the input signal v(t). The input signal v(t) is applied to low pass filter 1602 to produce a bandlimited modulation input signal at line 1603 that is received by voltage controlled oscillator 1604. A phase locked loop synthesizer 1660 provides a very accurate frequency reference for voltage controlled oscillator 1604 which produces a frequency modulated output signal with a center frequency of 910 MHz at line 1605. The system employs a minimum shift keying modulation in which the output modulates +/−5.0 MHz around the 910 MHz center frequency. This 910 +/−5.0 MHz signal is received by upconverter 1610 at a divide-by-2 circuit 1606 which acts to produce a 455+/−2.5 MHz frequency modulated signal at line 1607. This 455 +/−2.5 MHz signal is then amplified by power amplifier 1608 and received at one input of upconverter mixer 1611. Phase locked loop synthesizer 1661 provides a very accurate frequency reference for voltage controlled oscillator 1613 which produces a signal between 1.9450–2.0285 GHz at line 1662. This 1.9450–2.0285 GHz signal is then amplified by power amplifier 1609 and received at another input of upconverter mixer 1611. The 1.9450–2.0285 GHz signal on line 1662 is also provided to an input of the downconverter mixer 1623 of the receiver 1650. Upconverter mixer 1611 mixes the 455 +/−2.5 MHz signal with the 1.9450–2.0285 GHz signal to produce a signal at the 2.4 GHz ISM band of 2.4000 GHz–2.4835 GHz+/−2.5 MHz. This signal is amplified by power amplifier 1612 and then filtered by a band pass filter 1614. The output of the band pass filter 1614 is amplified by power amplifier 1615 and coupled through transmit/receive switch 1616 and received at band pass filter 1617. The transmit/receive switch 1616, which is controlled by the control circuit 950, is shown in the transmit position. The frequency modulated transmission signal at 2.4000 GHz–2.4835 GHz +/−2.5 MHz is then coupled through antenna switch 1618 and then received by either antenna 1620 or antenna 1619.

When in the receive mode, which is the normal mode of the transmit/receive station, a frequency modulated signal s(t) with a center frequency from 2.4000 GHz–2.4835 GHz is received at antenna 1619 or 1620. This signal is then coupled through antenna switch 1618 and received at band pass filter 1617. The band pass filter produces a filtered frequency modulated signal which is coupled through transmit/receive switch 1616 and received at a downconverter 1621. The downconverter 1621 includes an amplifier 1622 which drives a downconverter mixer 1623 by providing an amplified frequency modulated input signal that is 2.4000 GHz–2.4835 GHz+/–2.5 MHz. The other input of the mixer 1623 is received at line 1662 from the voltage controlled oscillator 1613. The downconverter mixer 1623 mixes the two input signals and produces a 455+/–2.5 MHz frequency modulated output signal. This output is received by amplifier 1624 which amplifies the signal and supplies it to a bandpass filter 1625. The output of the bandpass filter 1625 is supplied to an intermediate frequency amplifier 1626 which provides approximately 44dB of power amplification. The output of the amplifier 1626 is received by a second stage bandpass filter 1627. The output of the second stage bandpass filter 1627 is supplied to a second stage intermediate frequency amplifier 1628 which provides approximately 60 dB of power amplification. The output of the second stage intermediate frequency amplifier 1628 is supplied to the aggregate quadrature detector circuit 1640 which produces a demodulated output which is received at low pass filter 1644. In an alternate embodiment, the output of the second stage intermediate frequency amplifier is supplied to a divide-by-four circuit which produces a frequency modulated output at 113.75 MHz+/–625 kHz, and this output is supplied to the aggregate quadrature detector circuit 1640. The aggregate quadrature detector circuit was explained previously in greater detail with respect to FIG. 9. The output of the low pass filter 1644 is supplied to the comparator circuit 940. This is the same comparator circuit illustrated in FIG. 9. The output of the comparator circuit is a demodulated TTL level signal that is supplied to the control circuit 950. The control circuit 950 utilizes the comparator output to run the tuning algorithm described previously with respect to FIG. 11.

When in the transmit mode, the system is designed such that enough energy spills across the transmit/receive switch 1616 to drive the receiver 1650. The system uses this leakage 1630 to provide the accurate frequency reference with which to tune quadrature detector 910 of the aggregate quadrature detector circuit 1640 in the manner discussed previously. In one embodiment of the system, the control circuit 950 periodically, every 200 milliseconds in conjunction with a system heartbeat signal, sets the transmit/receive switch 1616 to the transmit position and causes a low power unmodulated continuous wave signal to be transmitted by the transmitter 1600. The leakage of this signal across the transmit/receive switch 1616 provides the receiver 1650 with a 455 MHz signal at the output of the downconverter 1621. The digital logic 952 of control circuit 950 then steps through the algorithm described above with respect to FIG. 11 in order to tune the output of the quadrature detector 910. The entire tuning cycle described above takes approximately 1 millisecond.

Although illustrative embodiments of the invention have been described in detail herein with reference to the accompanying drawings, it is to be understood that the invention is not limited to those precise embodiments. They are not intended to be exhaustive or to limit the invention to the precise forms disclosed. As such, many modifications and variations will be apparent to practitioners skilled in this art. Accordingly, it is intended that the scope of the invention be defined by the following claims and their equivalents.

What is claimed is:

1. In a system using a quadrature detector that demodulates a frequency modulated signal to provide an output signal on an output node, wherein the output signal comprises a current, an apparatus for tuning the quadrature detector, comprising:

a sampler, coupled to the output node, which converts the output signal into a sequence of samples; and a control circuit, electrically coupled to the sampler, which determines an offset adjustment value in response to the sequence of samples, and provides a correction signal in response to the offset adjustment value; and a circuit responsive to the correction signal to generate an offset current and to supply the offset current to the output node for combination with the output signal.

2. The apparatus for tuning a quadrature detector of claim 1, wherein the sampler comprises a converter electrically coupled to the output node which receives the output signal, and provides a sequence of Transistor-Transistor Logic (TTL) level signals.

3. The apparatus for tuning a quadrature detector of claim 1 further comprising a tunable RLC tank circuit electrically coupled to the quadrature detector, the tank circuit comprising a variable capacitor.

4. The apparatus for tuning a quadrature detector of claim 1 wherein the control circuit comprises digital logic.

5. The apparatus for tuning a quadrature detector of claim 1 wherein the control circuit comprises digital logic, and the circuit responsive to the correction signal comprises a digital to analog converter.

6. The apparatus for tuning a quadrature detector of claim 1 further comprising a source of a training signal whose frequency is substantially equal to a reference frequency, and a switch to periodically supply the training signal to the quadrature detector.

7. The apparatus for tuning a quadrature detector of claim 6 wherein the control circuit is coupled to the switch, and executes an algorithm to determine the correction signal during application of the training signal.

8. The apparatus for tuning a quadrature detector of claim 6 wherein the control circuit comprises digital logic.

9. The apparatus for tuning a quadrature detector of claim 6 wherein the sampler comprises a converter electrically coupled to the output node which receives the output signal, and provides a sequence of Transistor-Transistor Logic (TTL) level signals.

10. The apparatus for tuning a quadrature detector of claim 6 wherein the control circuit comprises a digital logic, and the circuit responsive to the correction signal comprises a digital to analog converter.

11. An apparatus for demodulating a frequency modulated signal, the apparatus comprising:

a quadrature detector circuit which receives the frequency modulated signal and outputs a first signal that indicates the frequency of the frequency modulated signal and also includes an offset;

an offset adjustment circuit which combines an offset correction with the first signal to compensate for the offset in response to a correction signal and that provides an offset adjusted signal at an output node;

a control circuit operably connected to the offset adjustment circuit for supplying the correction signal; and a source of a training signal whose frequency is substantially equal to a reference frequency, and a switch to periodically supply the training signal to the quadrature detector.

12. The apparatus for demodulating a frequency modulated signal of claim 11 further comprising a sampler, coupled to the output node, which converts the offset adjusted signal into a sequence of samples.

13. The apparatus for demodulating a frequency modulated signal of claim 12 wherein the control circuit supplies the correction signal in response to the sequence of samples.

14. The apparatus for demodulating a frequency modulated signal of claim 11 wherein the control circuit is coupled to the switch, and executes an algorithm to determine the correction signal during application of the training signal.

15. The apparatus for demodulating a frequency modulated signal of claim 14 wherein the control circuit comprises a digital logic and a digital-to-analog converter responsive to the digital logic.

16. The apparatus for demodulating a frequency modulated signal of claim 11 further comprising a tunable RLC tank circuit electrically coupled to the quadrature detector circuit, wherein the tank circuit includes a variable capacitor.

17. The apparatus for demodulating a frequency modulated signal of claim 11 wherein the control circuit comprises a digital logic and a digital-to-analog converter responsive to the digital logic.

18. The apparatus for demodulating a frequency modulated signal of claim 11 further comprising an output buffer circuit electrically coupled to the offset adjustment circuit wherein the output buffer circuit receives the offset adjusted signal and provides a first demodulated signal.

19. The apparatus for demodulating a frequency modulated signal of claim 18 further comprising a comparator circuit electrically coupled to the output buffer circuit wherein the comparator circuit receives the first demodulated signal and provides a second demodulated signal which is a Transistor-Transistor Logic (TTL) level signal.

20. The apparatus for demodulating a frequency modulated signal of claim 19 wherein the control circuit comprises a digital logic which is response to the second demodulated signal and a digital-to-analog converter which is responsive to the digital logic.

21. The apparatus for demodulating a frequency modulated signal of claim 20 wherein the control circuit is coupled to the switch, and executes an algorithm to determine the correction signal during application of the training signal.

22. In a system for the wireless transfer of frequency modulated information, a transmit/receive station comprising:

an antenna;

a transmit/receive switch;

a transmitter connected to the antenna through the transmit/receive switch, which transmits a frequency modulated signal; and a receiver connected to the antenna through the transmit/receive switch, for receiving and demodulating a frequency modulated signal wherein the receiver comprises:

a quadrature detector circuit which receives the frequency modulated signal and outputs a first signal that indicates the frequency of the frequency modulated signal and also includes an offset;

an offset adjustment circuit which combines an offset correction with the first signal to compensate for the offset in response to a correction signal and that provides an offset adjusted signal at an output node;

a control circuit operably connected to the offset adjustment circuit for supplying the correction signal; and a source of a training signal whose frequency is substantially equal to a reference frequency, and a switch to periodically supply the training signal to the quadrature detector.

23. The transmit/receive station of claim 22 wherein the transmit/receive station is coupled with a host computer, and the control circuit comprises a routine executed on the host computer to determine the correction signal and a digital-to-analog converter responsive to the routine.

24. The transmit/receive station of claim 22 wherein the receiver further comprises a sampler, coupled to the output node, which converts the offset adjusted signal into a sequence of samples.

25. The transmit/receive station of claim 24 wherein the control circuit supplies the correction signal in response to the sequence of samples.

26. The transmit/receive station of claim 22 wherein the control circuit is coupled to the switch, and executes an algorithm to determine the correction signal during application of the training signal.

27. The transmit/receive station of claim 22 wherein the transmit/receive station is coupled with a host computer, and the control circuit comprises a routine executed on the host computer to determine the correction signal and a digital-to-analog converter responsive to the routine, wherein the control circuit is coupled to the switch, and the routine is executed during application of the training signal.

28. The transmit/receive station of claim 26 wherein the control circuit comprises a digital logic and a digital-to-analog converter responsive to the digital logic.

29. The transmit/receive station of claim 22 further comprising a tunable RLC tank circuit, wherein the tank circuit includes a variable capacitor.

30. The transmit/receive station of claim 22 wherein the receiver further comprises an output buffer circuit electrically coupled to the offset adjustment circuit wherein the output buffer circuit receives the offset adjusted signal and provides a first demodulated signal.

31. The transmit/receive station of claim 30 wherein the receiver further comprises a comparator circuit electrically coupled to the output buffer circuit wherein the comparator circuit receives the first demodulated signal and provides a second demodulated signal which is a Transistor-Transistor Logic (TTL) level signal.

32. The transmit/receive station of claim 31 wherein the control circuit comprises a digital logic which is responsive to the second demodulated signal and a digital-to-analog converter which is responsive to the digital logic.

33. The transmit/receive station of claim 31 wherein the transmit/receive station is coupled with a host computer, and the control circuit comprises a routine executed on the host computer to determine the correction signal and a digital-to-analog converter responsive to the routine, wherein the control circuit is responsive to the second demodulated signal.

34. The transmit/receive station of claim 22 wherein the control circuit comprises a digital logic and a digital-to-analog converter which is responsive to the digital logic.

35. The transmit/receive station of claim 31 wherein the transmit/receive station is coupled with a host computer, and the control circuit comprises a routine executed on the host computer to determine the correction signal and a digital-to-analog converter responsive to the routine, wherein the control circuit is responsive to the second demodulated signal and is coupled to the switch, and wherein the routine is executed during application of the training signal.

36. The transmit/receive station of claim 32 wherein the control circuit is coupled to the switch, and executes an algorithm to determine the correction signal during application of the training signal.

\* \* \* \* \*